US009524903B2

(12) United States Patent
Lee

(10) Patent No.: US 9,524,903 B2
(45) Date of Patent: Dec. 20, 2016

(54) INTERCONNECTION STRUCTURE, SEMICONDUCTOR DEVICE, AND METHOD OF MANUFACTURING THE SAME

(71) Applicant: SK hynix Inc., Icheon-si Gyeonggi-do (KR)

(72) Inventor: Nam Jae Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/571,764

(22) Filed: Dec. 16, 2014

(65) Prior Publication Data

US 2016/0027730 A1    Jan. 28, 2016

(30) Foreign Application Priority Data

Jul. 28, 2014 (KR) .................. 10-2014-0096003

(51) Int. Cl.
*H01L 29/40* (2006.01)
*H01L 21/768* (2006.01)
*H01L 27/115* (2006.01)

(52) U.S. Cl.
CPC ... *H01L 21/76816* (2013.01); *H01L 27/11565* (2013.01); *H01L 27/11575* (2013.01); *H01L 27/11582* (2013.01)

(58) Field of Classification Search
CPC ...... H01L 21/822; H01L 21/308; H01L 21/28; H01L 23/48; H01L 23/52; H01L 21/82; H01L 21/8234; H01L 27/115; H01L 29/51; H01L 29/10; H01L 293/528; H01L 293/423
See application file for complete search history.

(56) References Cited

U.S. PATENT DOCUMENTS

| | | | |
|---|---|---|---|
| 2010/0207186 A1* | 8/2010 | Higashi et al. ............... | 257/314 |
| 2012/0070944 A1* | 3/2012 | Kim et al. .................... | 438/128 |
| 2012/0306090 A1 | 12/2012 | Smith et al. | |
| 2013/0252412 A1* | 9/2013 | Poiroux ........... | H01L 21/76897 438/586 |

FOREIGN PATENT DOCUMENTS

KR     1020150120031 A     10/2015

* cited by examiner

*Primary Examiner* — Daniel Luke
*Assistant Examiner* — Khatib Rahman
(74) *Attorney, Agent, or Firm* — William Park & Associates Ltd.

(57) ABSTRACT

An interconnection structure may include insulating layers stacked stepwise and dielectric layers interposed between the insulating layers. The interconnection structure may include conductive layers interposed between the insulating layers and surrounding sidewalls of the dielectric layers, respectively. The interconnection structure may include contact plugs each coupled to one of the conductive layers. The contact plugs may at least partially pass through the dielectric layers.

23 Claims, 35 Drawing Sheets

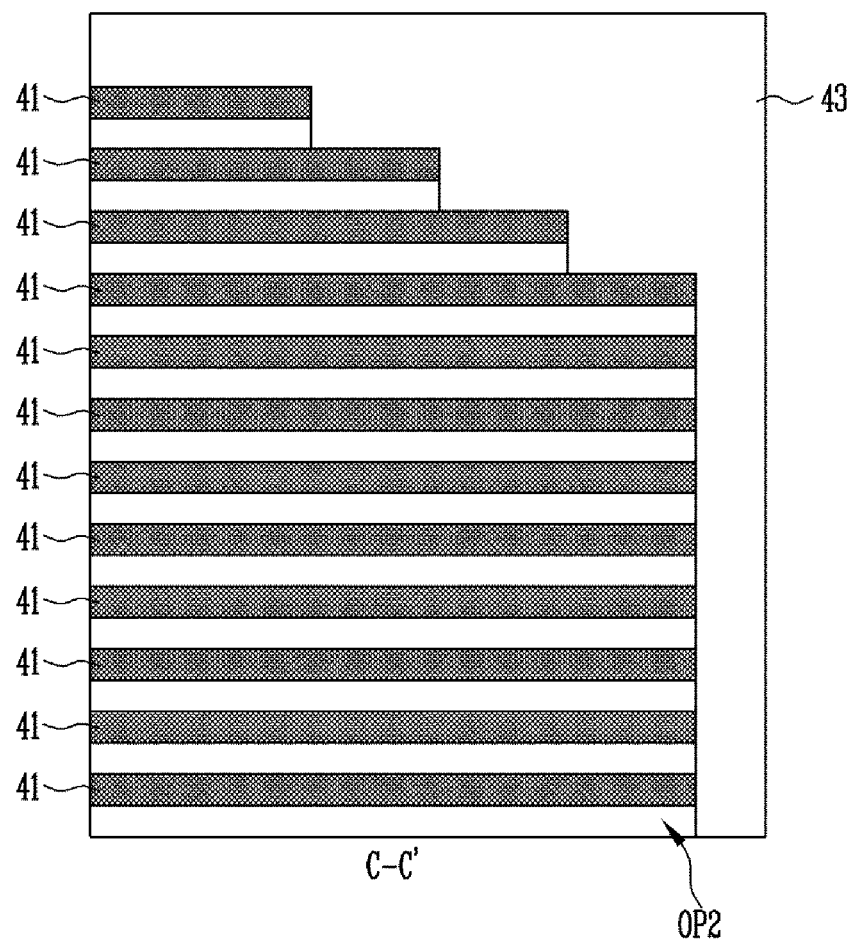

INTERCONNECTION STRUCTURE, SEMICONDUCTOR DEVICE, AND METHOD OF MANUFACTURING THE SAME

CROSS-REFERENCE TO RELATED APPLICATION

The present application claims priority to Korean patent application number 10-2014-0096003 filed on Jul. 28, 2014, in the Korean Intellectual Property Office, the entire disclosure of which is incorporated by reference herein.

BACKGROUND

1. Technical Field

Various embodiments relate generally to an interconnection structure, a semiconductor device, and a method of manufacturing the same and, more particularly, to an interconnection structure having a three-dimensional structure, a semiconductor device, and a method of manufacturing the same.

2. Related Art

Non-volatile memory devices retain stored data in the absence of a power supply. Two-dimensional memory devices having memory cells fabricated in a single layer over a silicon substrate have reached their limits when it comes to increasing their degree of integration. Accordingly, three-dimensional non-volatile memory devices having memory cells stacked in a vertical direction over a silicon substrate have been proposed A three-dimensional non-volatile memory device has a structure having interlayer insulating layers and gate electrodes that are alternately stacked with each other, and channel layers penetrate therethrough. Memory cells may be stacked along the channel layers. In addition, desired memory cells may be selectively driven by coupling contact plugs to the stacked word lines, respectively.

However, to realize the three-dimensional non-volatile memory device having the above structure, the contact plugs are to be formed with varying depths. The varying depths of the contact plugs may make it more difficult to manufacture the memory device. In addition, the contact plugs may pass through the word lines to form a bridge.

BRIEF SUMMARY

An interconnection structure according to an embodiment may include insulating layers stacked stepwise, dielectric layers interposed between the insulating layers, and conductive layers interposed between the insulating layers and surrounding sidewalls of the dielectric layers, respectively. The interconnection structure may include contact plugs each coupled to one of the conductive layers. The contact plugs may at least partially pass through the dielectric layers.

A semiconductor device according to an embodiment may include a first stacked structure including first to n-th insulating layers and first to n-th dielectric layers stacked alternately with each other. The semiconductor device may include first to n-th conductive layers interposed between the first to n-th insulating layers and surrounding sidewalls of the first to n-th dielectric layers, respectively. N may be a natural number of 2 or more. The first stacked structure may have a stepped structure, a second stacked structure including first to 2n-th insulating layers and first to 2n-th dielectric layers stacked alternately with each other, and first to 2n-th conductive layers interposed between the first to 2n-th insulating layers and surrounding sidewalls of the first to 2n-th dielectric layers, respectively. N+1st to 2n-th insulating layers, n+1st to 2n-th dielectric layers and n+1st to 2n-th conductive layers may have a stepped structure, and a slit insulating layer located between the first stacked structure and the second stacked structure.

An interconnection structure according to an embodiment may include an upper conductive layer including an upper dielectric layer and a pad region surrounding a terminal side wall of the upper dielectric layer. The interconnection structure may include a lower conductive layer including a lower dielectric layer and a pad region surrounding a terminal side wall of the lower dielectric layer, the lower conductive layer located below the upper conductive layer. The interconnection structure may include a contact plug coupled to the pad region of the upper conductive layer and the lower dielectric layer.

DETAILED DESCRIPTION

Figure 1A:
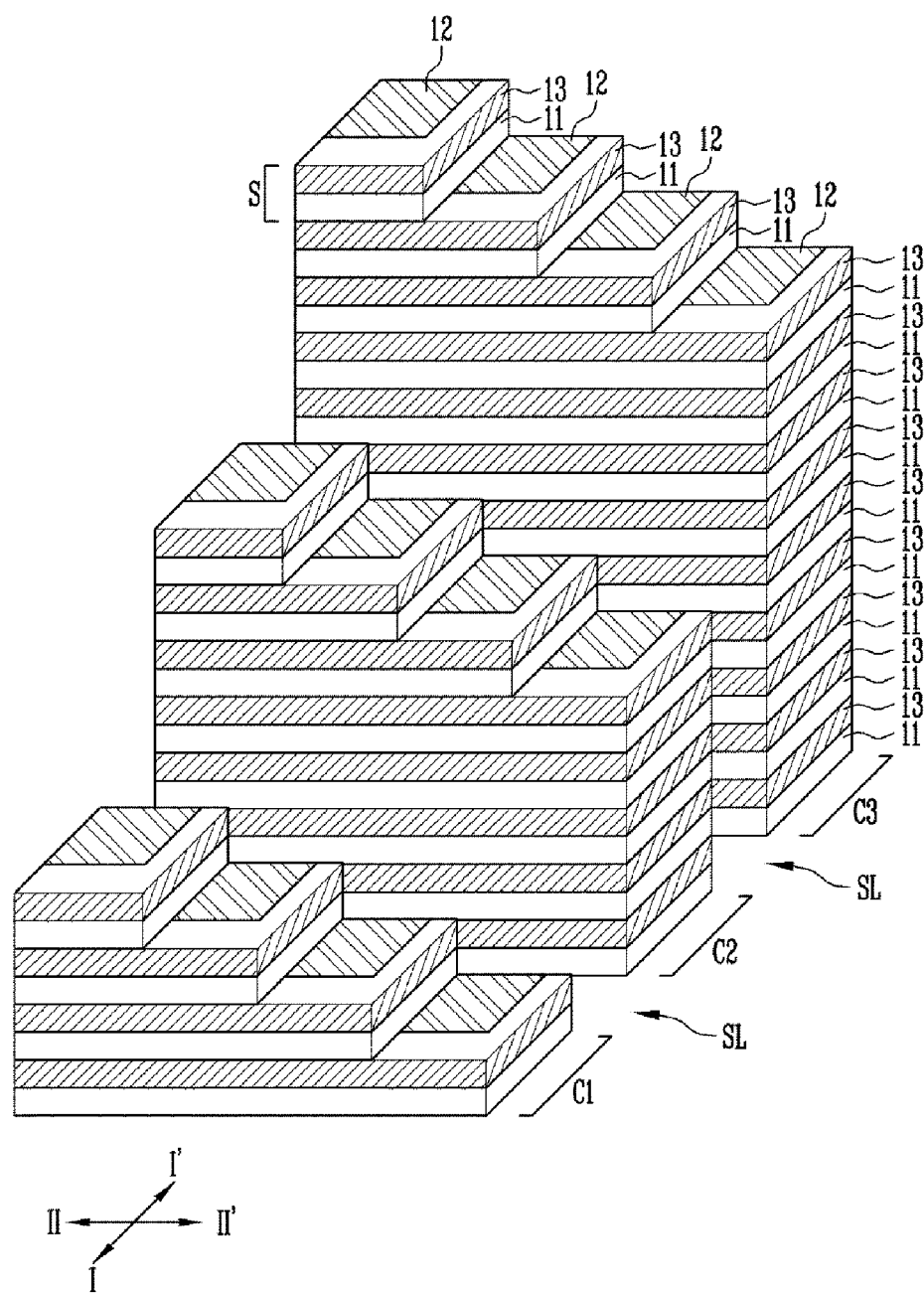
FIGS. 1A to 1C are perspective views illustrating representations of the structure of interconnection structures according to an embodiment.

Hereinafter, various embodiments will be described with reference to the accompanying drawings. In the drawings, illustrated thicknesses and distances of components are exaggerated compared to an actual physical thickness and interval for convenience of illustration. In the following description, detailed explanation of known related functions and constitutions is omitted to avoid unnecessarily obscuring the subject matter disclosed herein. Like reference numerals refer to like elements throughout the specification and drawings.

Various embodiments may generally relate to a semiconductor device having a simplified manufacturing process and a stabilized structure, and a method of manufacturing the same.

Figure 1B:
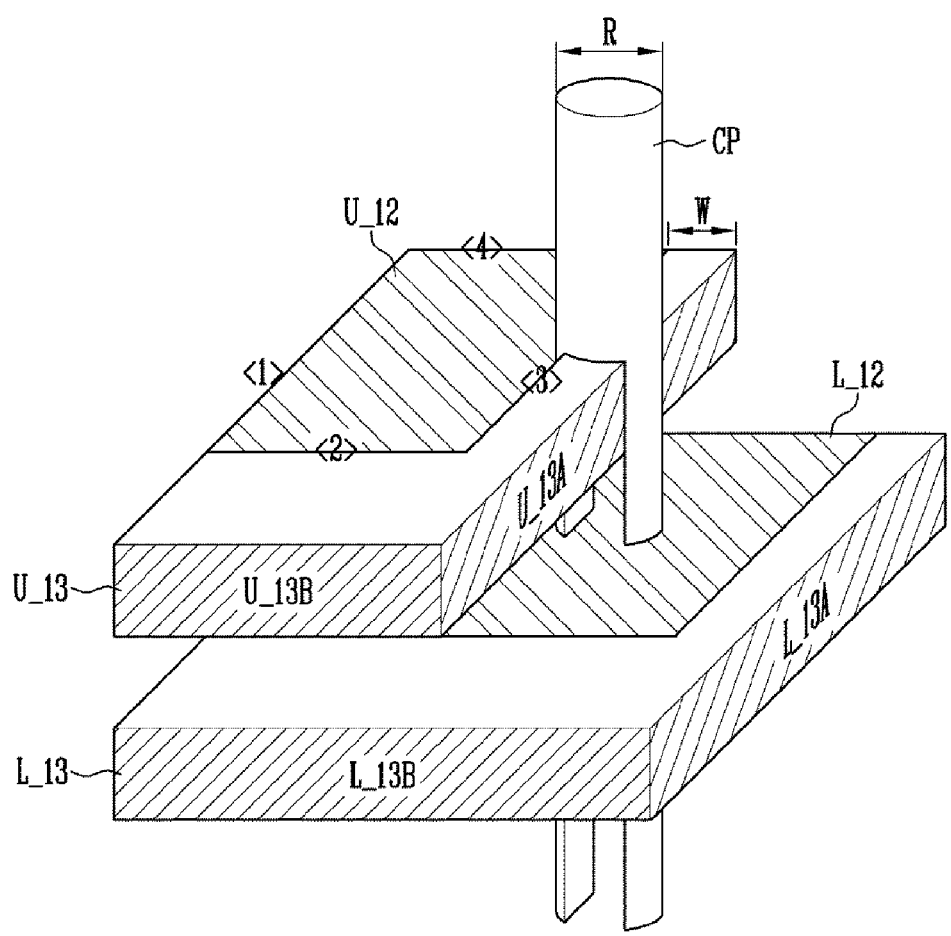
Figure 1C:
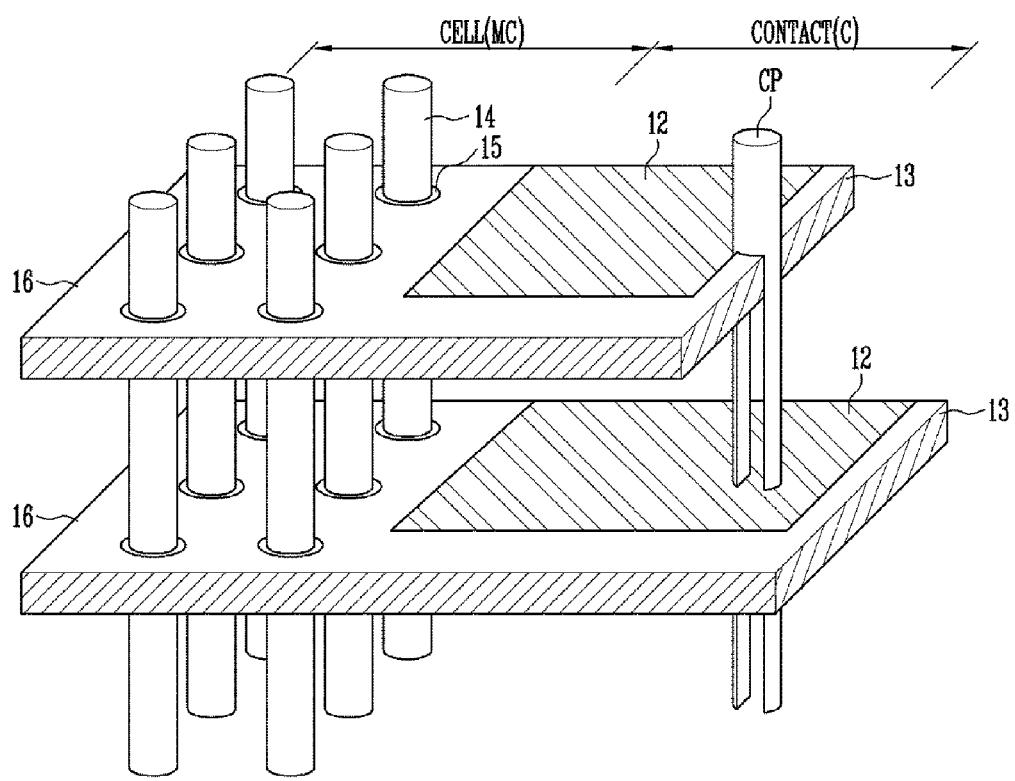

FIGS. 1A to 1C are perspective views illustrating representations of the structure of interconnection structures according to an embodiment.

FIG. 1A is a perspective view illustrating a representation of the overall structure of interconnection structures according to an embodiment. Referring to FIG. 1A, each of the interconnection structures C1 to C3 may include insulating layers 11 stacked stepwise, dielectric layers 12 interposed between the insulating layers 11, and conductive layers 13 interposed between the insulating layers 11 and surrounding sidewalls of the dielectric layers 12, respectively.

The conductive layers 13 may include polysilicon or tungsten to form pad portions to transfer bias to the stacked word lines. The insulating layers 11 may insulate the stacked conductive layers 13 and include an oxide. In addition, the dielectric layers 12 may be formed of the remaining portions of sacrificial layers used in the manufacturing process, and include a nitride.

The semiconductor device may include the plurality of interconnection structures C1 to C3. The interconnection structures C1 to C3 may be arranged parallel to each other or substantially parallel to each other in a first direction I-I'. In addition, slits SL may be located between the neighboring interconnection structures C1 to C3. Slit insulating layers (not illustrated) may be formed in the slits SL.

The interconnection structures C1 to C3 may have different heights. For example, the first interconnection structure C1 may include first to n-th insulating layers 11, first to n-th dielectric layers 12, and first to n-th conductive layers 13. The second interconnection structure C2 may include first to 2n-th insulating layers 11, first to 2n-th dielectric layers 12, and first to 2n-th conductive layers 13. The third interconnection structure C3 may include first to 3n-th insulating layers 11, first to 3n-th dielectric layers 12, and first to 3n-th conductive layers 13. Here, n may be a natural number of 2 or more.

The first interconnection structure C1 may have a stepped structure including the first to n-th insulating layers 11, the first to n-th dielectric layers 12 and the first to n-th conductive layers 13. The n+1st to 2n-th insulating layers 11, the n+1st to 2n-th dielectric layers 12 and the n+1st to 2n-th conductive layers 13 of the second interconnection structure C2 may have a stepped structure. However, the first to n-th insulating layers 11, the first to n-th dielectric layers 12 and the first to n-th conductive layers 13 of the second interconnection structure C2 may not have a stepped structure. In addition, the 2n+1st to 3n-th insulating layers 11, the 2n+1st to 3n-th dielectric layers 12 and the 2n+1st to 3n-th conductive layers 13 of the third interconnection structure C3 may have a stepped structure. However, the first to 2n-th insulating layers 11, the first to 2n-th dielectric layers 12 and the first to 2n-th conductive layers 13 may not have a stepped structure. According to the first to third interconnection structures including the above-described structures, the pad portions arranged on first to 3n-th layers may be spread among the three interconnection structures C1 to C3. Therefore, the area of the interconnection structures may be reduced as compared when all pad portions on the first to 3n-th layers are arranged on a single interconnection.

In addition, in FIG. 1A, each of the steps (S) forming the stepped structure may include the upper dielectric layer 12, the upper conductive layer 13 and the lower insulating layer 11. However, the single step (S) may include the upper insulating layer 11, the lower dielectric layer 12 and the lower conductive layer 13.

FIG. 1B is an enlarged perspective view illustrating a representation of a portion of an interconnection structure according to an embodiment. Referring to FIG. 1B, sidewalls of an upper dielectric layer U_12 may be surrounded by an upper conductive layer U_13, and sidewalls of a lower dielectric layer L_12 may be surrounded by a lower conductive layer L_13. In addition, the insulating layers 11 may be interposed between the upper conductive layer U_13 and the upper dielectric layer U_12 and between the lower conductive layer L_13 and the lower dielectric layer L_12. However, in FIG. 1B, for convenience of explanation, the insulating layers 11 are removed.

The structures of the upper dielectric layer U_12 and the upper conductive layer U_13 are described below. For example, the upper dielectric layer U_12 may include four sidewalls <1> to <4>. The first sidewall <1> may be coupled to a memory cell structure and may not be surrounded by the upper conductive layer U_13. The third sidewall <3> may be a terminal sidewall facing the first sidewall <1> and be surrounded by the upper conductive layer U_13. In addition, the second sidewall <2> and the fourth sidewall <4> facing each other may contact a slit insulating layer (not illustrated). At least one of the second and fourth sidewalls <2> and <4> may be surrounded by the upper conductive layer U_13. According to an embodiment, only the second sidewall <2> may be surrounded by the upper conductive layer U_13. The upper conductive layer U_13 may surround at least two sidewalls including the terminal sidewall of the upper dielectric layer U_12. For example, the upper conductive layer U_13 may have an L shape.

The upper conductive layer U_13 may include a pad region U_13A surrounding the terminal third sidewall <3> and a connection region U_13B surrounding the second sidewall <2>. For example, the pad region U_13A may contact a contact plug CP, and the connection region U_13B may couple the pad region U_13A and the gate electrode included in the memory cell structure.

The contact plugs CP may be coupled to the conductive layers U_13 and L_13. According to an embodiment, only the contact plug CP coupled to the upper conductive layer U_13 is illustrated. The contact plug CP may be coupled to the pad region U_13A of the conductive layer U_13 and contact a top surface and sidewalls thereof. In addition, in order to ensure an overlay margin, a diameter R of the contact plug CP may be greater than a width W of the pad region U_13A. Therefore, a region of the contact plug CP which does not overlap with the pad region U_13A may extend down from the pad region U_13A and pass through the dielectric layer L_12 and the insulating layers 11 located under the coupled conductive layer U_13. In addition, in order that the pad region U_13A of the upper conductive layer U_13A may not overlap with the pad region L_13A of the lower conductive layer L_13, the dielectric layer L_12 may be located under the pad region U_13A of the upper conductive layer U_13. Therefore, even when the contact plug CP extends downward, the contact plug CP may not be coupled to the lower conductive layer L_13 and a bridge may be prevented from being formed between the upper conductive layer U_13 and the lower conductive layer L_13. The connection region L_13B of the lower conductive layer L_13 may couple the pad region L_13A and the gate electrode included in the memory cell structure.

FIG. 1C is a perspective view illustrating a representation of an interconnection coupled to another structure according to an embodiment. Referring to FIG. 1C, a semiconductor device may include a cell region CELL and a contact region CONTACT. In addition, a memory cell structure MC including gate electrodes 16 and insulating layers (not illustrated) stacked alternately with each other may be located in the cell region CELL, and an interconnection structure C may be located in the contact region CONTACT.

The gate electrodes 16 included in the memory cell structure MC may be coupled to the conductive layers 13, respectively. For example, each of the gate electrodes 16 and each of the conductive layers 13 may be connected in a single body. The memory cell structure MC may further include channel layers 14 passing through the gate electrodes 16 and memory layers 15 interposed between the channel layers 14 and the gate electrodes 16. In addition, the memory layer may include a tunnel insulating layer, a data storage layer and a charge blocking layer. The data storage layer may include silicon, nitride, phase-change material, nanodots, or the like. Therefore, memory cells may be formed at intersections between the channel layers 14 and the gate electrodes 16.

Figure 2A:
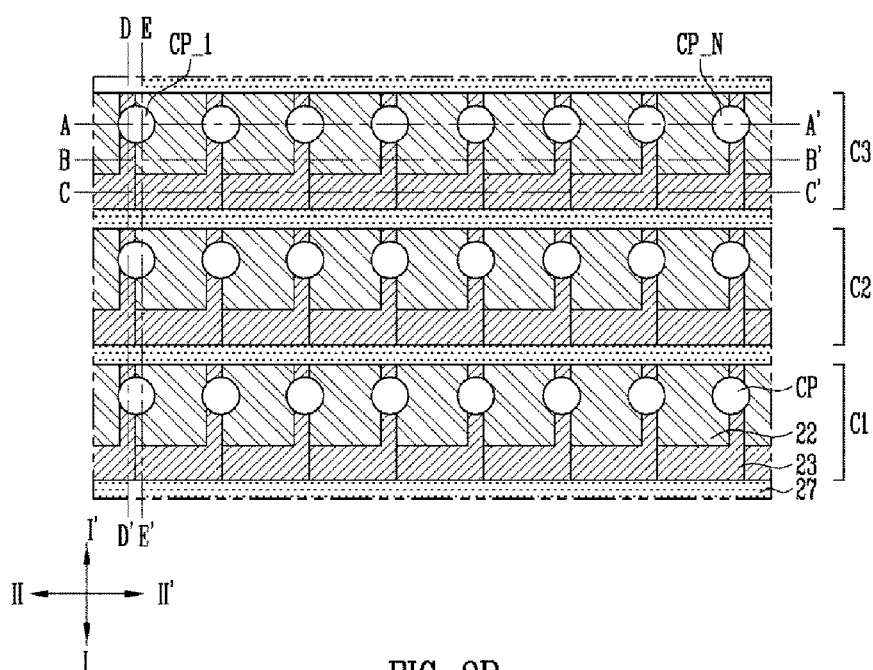
FIGS. 2A to 2F are a layout and cross-sectional diagrams illustrating representations of the structure of interconnection structures according to an embodiment.
Figure 2B:
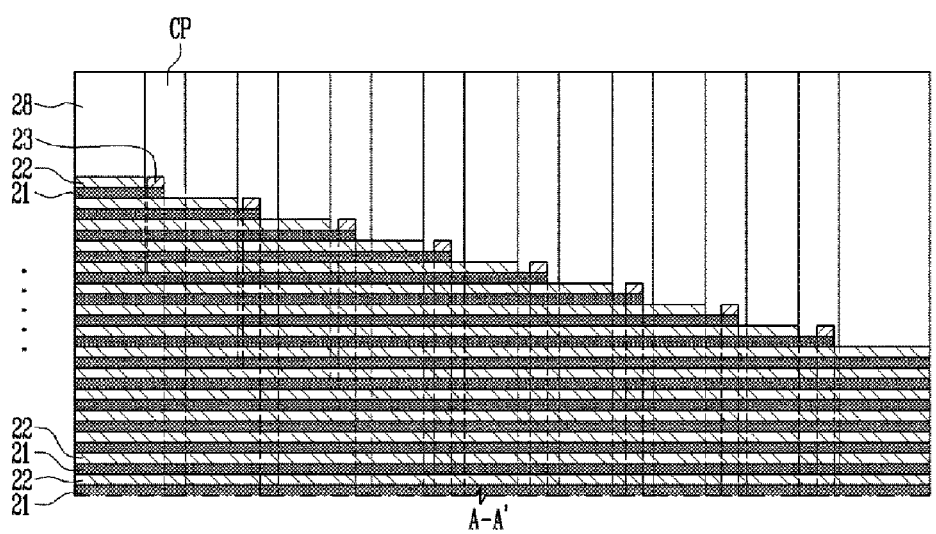
Figure 2C:
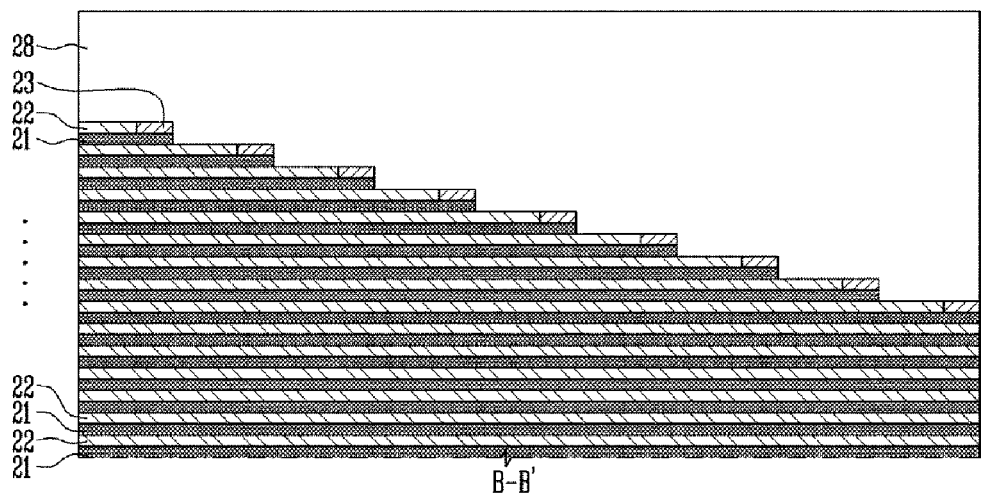
Figure 2D:
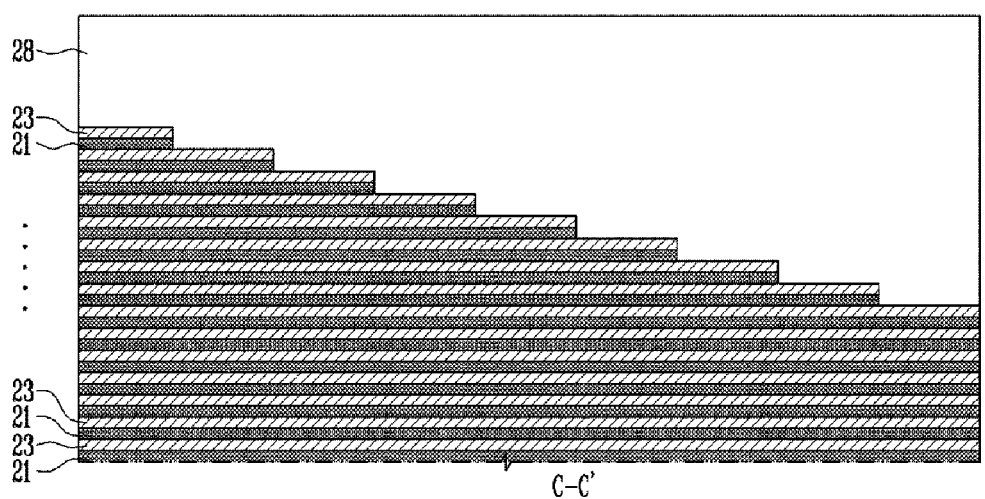
Figure 2E:
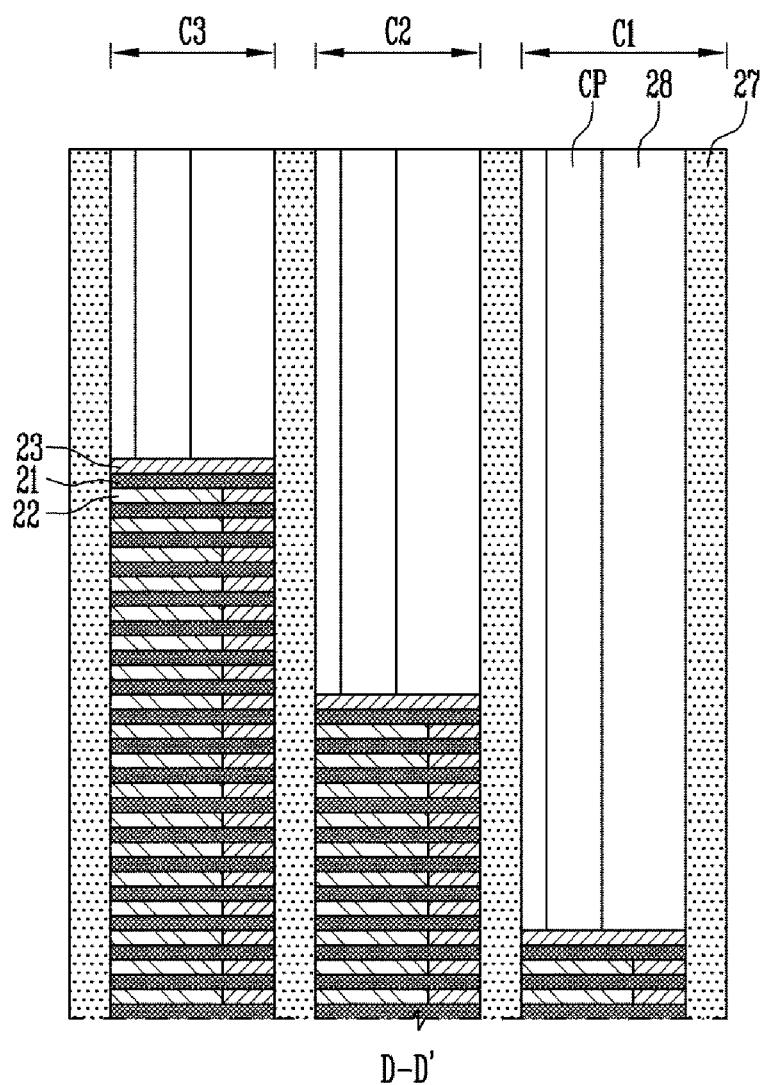
Figure 2F:
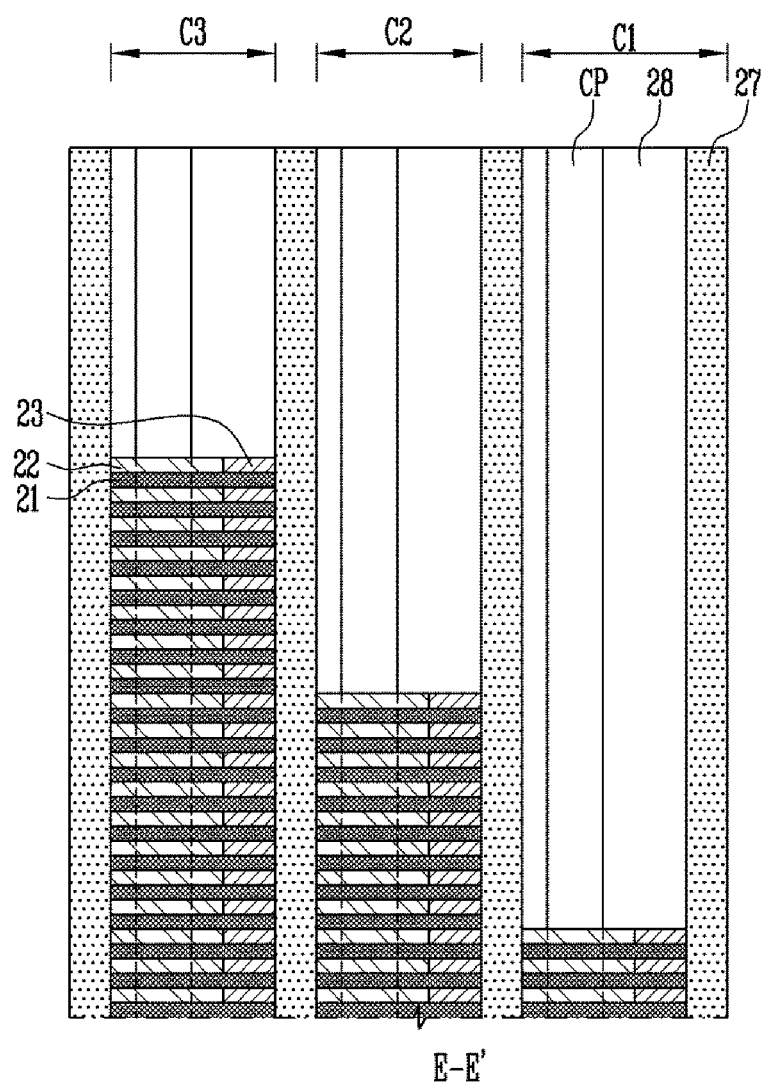

FIG. 2A is a layout illustrating a representation of interconnections according to an embodiment. FIG. 2B is a cross-sectional view taken along line A-A' of FIG. 2A. FIG. 2C is a cross-sectional view taken along line B-B' of FIG. 2A. FIG. 2D is a cross-sectional view taken along line C-C' of FIG. 2A. FIG. 2E is a cross-sectional view taken along line D-D' of FIG. 2A. FIG. 2F is a cross-sectional view taken along line E-E' of FIG. 2A. However, some of the lower layers are omitted from the cross-sectional views of FIGS. 2B to 2F.

Referring to FIGS. 2A and 2B, each of the contact plugs CP may pass through an interlayer insulating layer 28 to contact each of the conductive layers 23, and at least partially pass through lower insulating layers 21 and lower dielectric layers 22. The positions at which the conductive layers 23 and the contact plugs CP contact each other may vary depending on an overlay margin. For example, since a first contact plug CP_1 is tilted or biased to the left side (i.e., toward the II direction) and contacts the conductive layer 23, the right side of the first contact plug CP_1 may pass more deeply through the lower insulating layers 21 and the lower dielectric layers 22. In another example, since an N-th contact plug CP_N is tilted or biased to the right side (i.e., toward the II' direction) and contacts the conductive layer 23, the left side of the N-th contact plug CP_N may pass more deeply through the lower insulating layers 21 and the lower dielectric layers 22. In addition, since gaps between the interconnection structures C1 to C3 are filled with slit insulating layers 27, the conductive layers 23 formed on the same plane may be insulated from each other by the slit insulating layers 27.

Referring to FIG. 2C, a pad region of the conductive layer 23 may surround a terminal sidewall of the dielectric layer 22 in a second direction II-II'. In addition, referring to FIG. 2D, connection regions of the conductive layers 23 may be stacked alternately with the insulating layers 21.

Referring to FIG. 2E, a region of the contact plug CP contacting a top surface of the conductive layer 23 may not extend further down. On the other hand, referring to FIG. 2F, a region of the contact plug CP which does not contact the conductive layer 23 may at least partially pass through the lower insulating layers 21 and the lower dielectric layers 22.

According to the interconnection having the above-described structures, even when the contact plug CP passes through the lower layers, since the contact plug CP passes through lower insulating material layers, the contact plug CP may not form a bridge with the lower conductive layers 23.

Figure 3A:
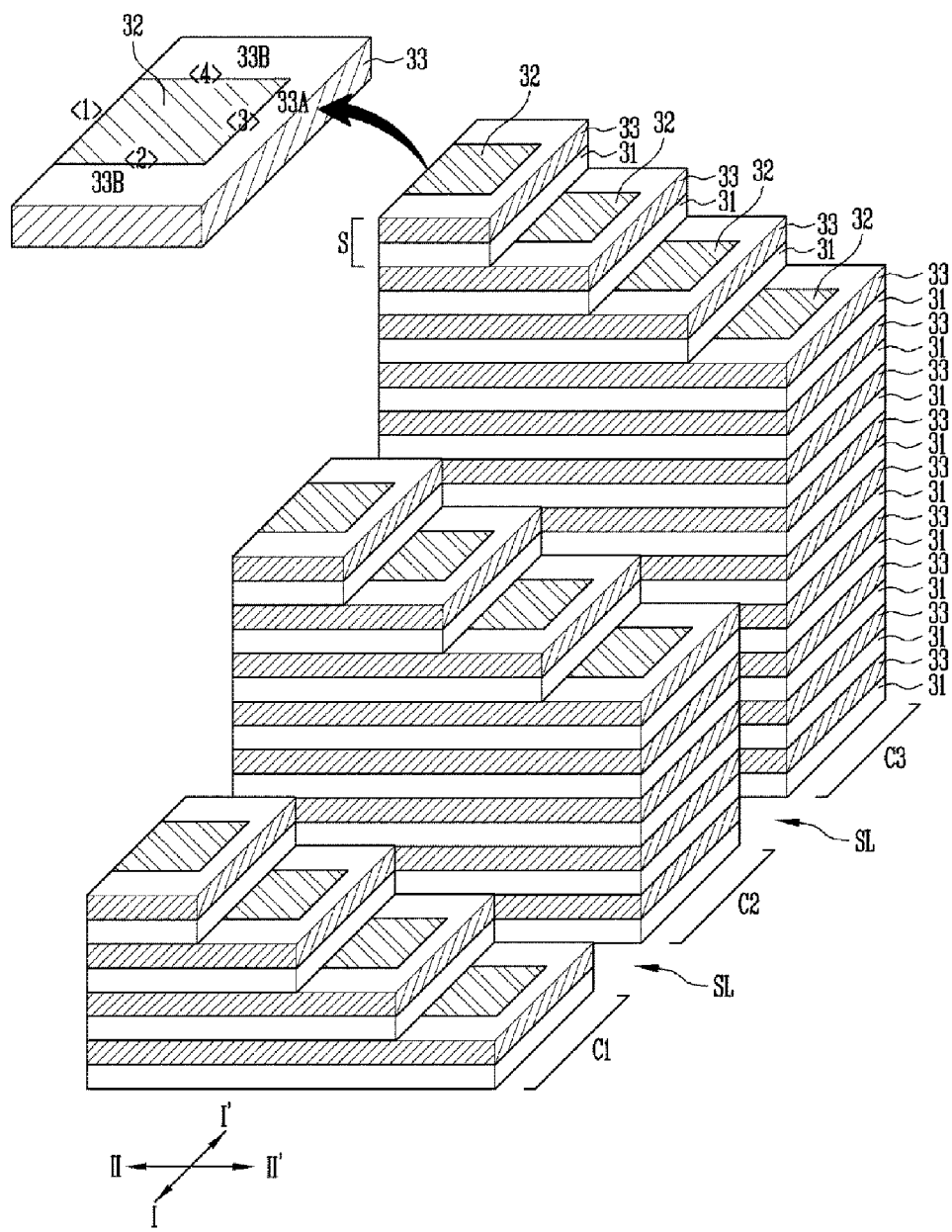
FIGS. 3A and 3B are a perspective view and a layout illustrating representations of the structure of interconnection structures according to an embodiment.
Figure 3B:
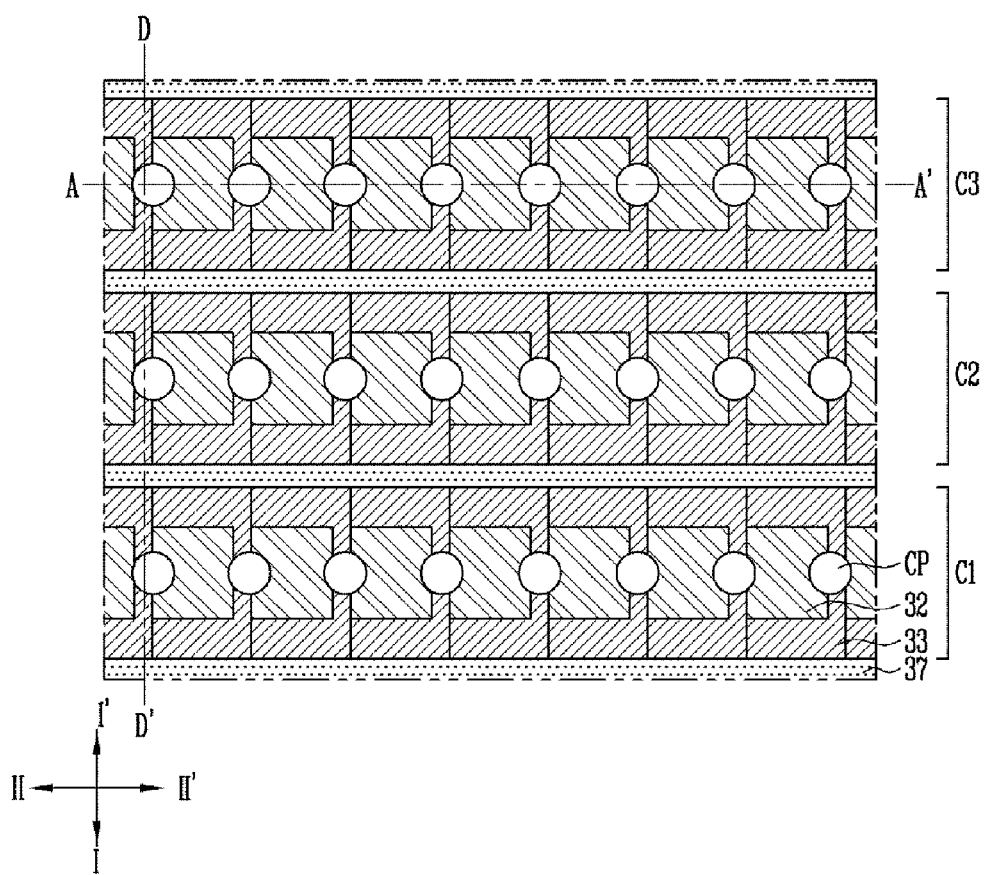

FIG. 3A is a perspective view illustrating a representation of the structure of interconnection structures according to an embodiment. FIG. 3B is a layout thereof. Hereinafter, a description of common contents with earlier described embodiments is omitted.

Referring to FIGS. 3A and 3B, the interconnection structure C1 to C3 may include insulating layers 31 stacked stepwise, dielectric layers 32 interposed between the insulating layers 31, and conductive layers 33 interposed between the insulating layers 31 and surrounding sidewalls of the dielectric layers 32, respectively.

The semiconductor device may include the interconnection structures C1 to C3. The interconnection structures C1 to C3 may be arranged parallel to each other or substantially parallel to each other in the first direction I-I'. In addition, the slits SL may be located between the neighboring interconnection structures C1 to C3. Slit insulating layers 37 may be located in the slits SL.

The conductive layer 33 may surround second, third and fourth sidewalls <2>, <3> and <4> of the dielectric layer 32. In other words, the conductive layer 33 may surround at least three sidewalls including a terminal sidewall of the dielectric layer 32. For example, the conductive layer 33 may have a C shape. The conductive layer 33 may include a pad region 33A surrounding the third sidewall <3>, which is a terminal sidewall, and connection regions 33B surrounding the second and fourth sidewalls <2> and <4>. For example, the connection regions 33B may be formed at both sides of the slit insulating layer 37. In the interconnection structures having the above-described structure, the pad region 33A may contact the contact plug CP, and the connection region 33B may couple the pad region 33A to the gate electrode included in the memory cell structure.

Figure 4:
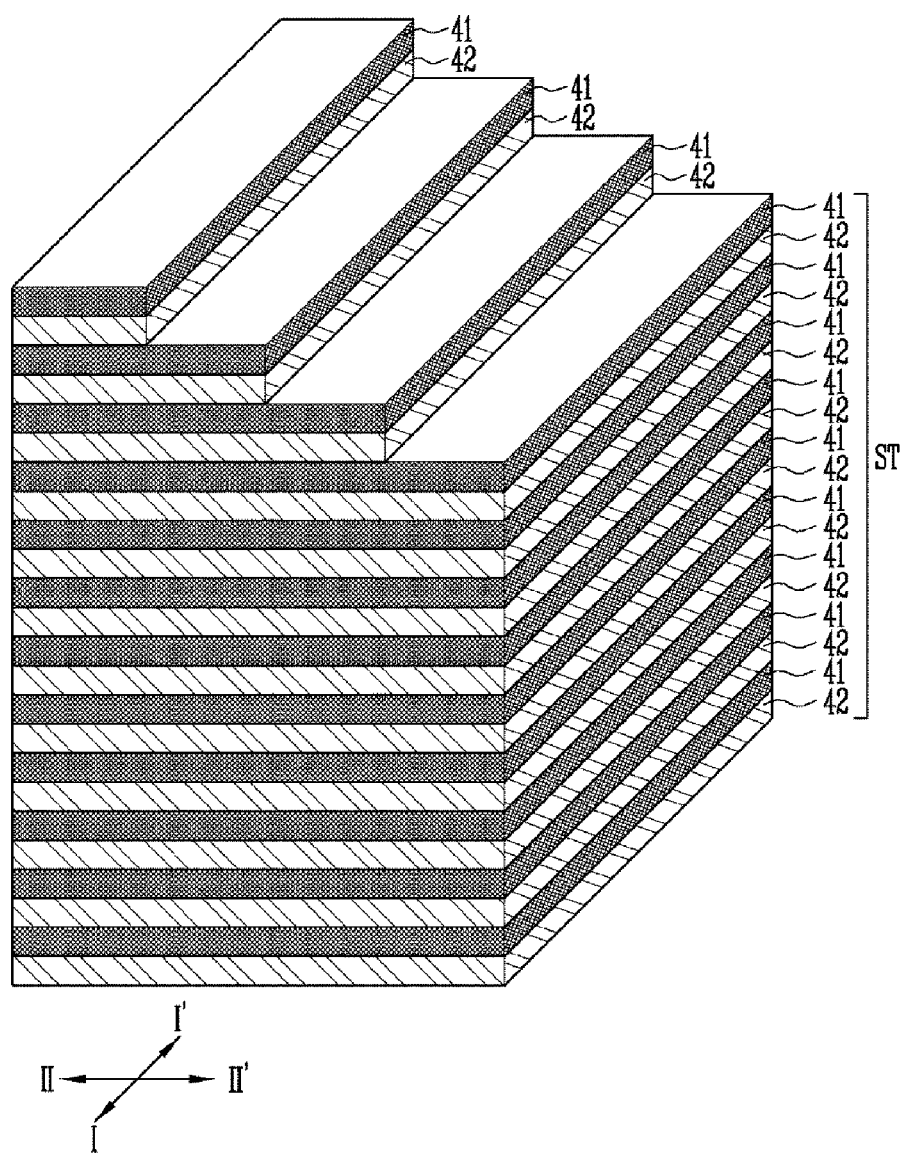
FIGS. 4 to 10B are layouts and cross-sectional diagrams illustrating representations of a method of manufacturing a semiconductor device according to an embodiment.
Figure 5:
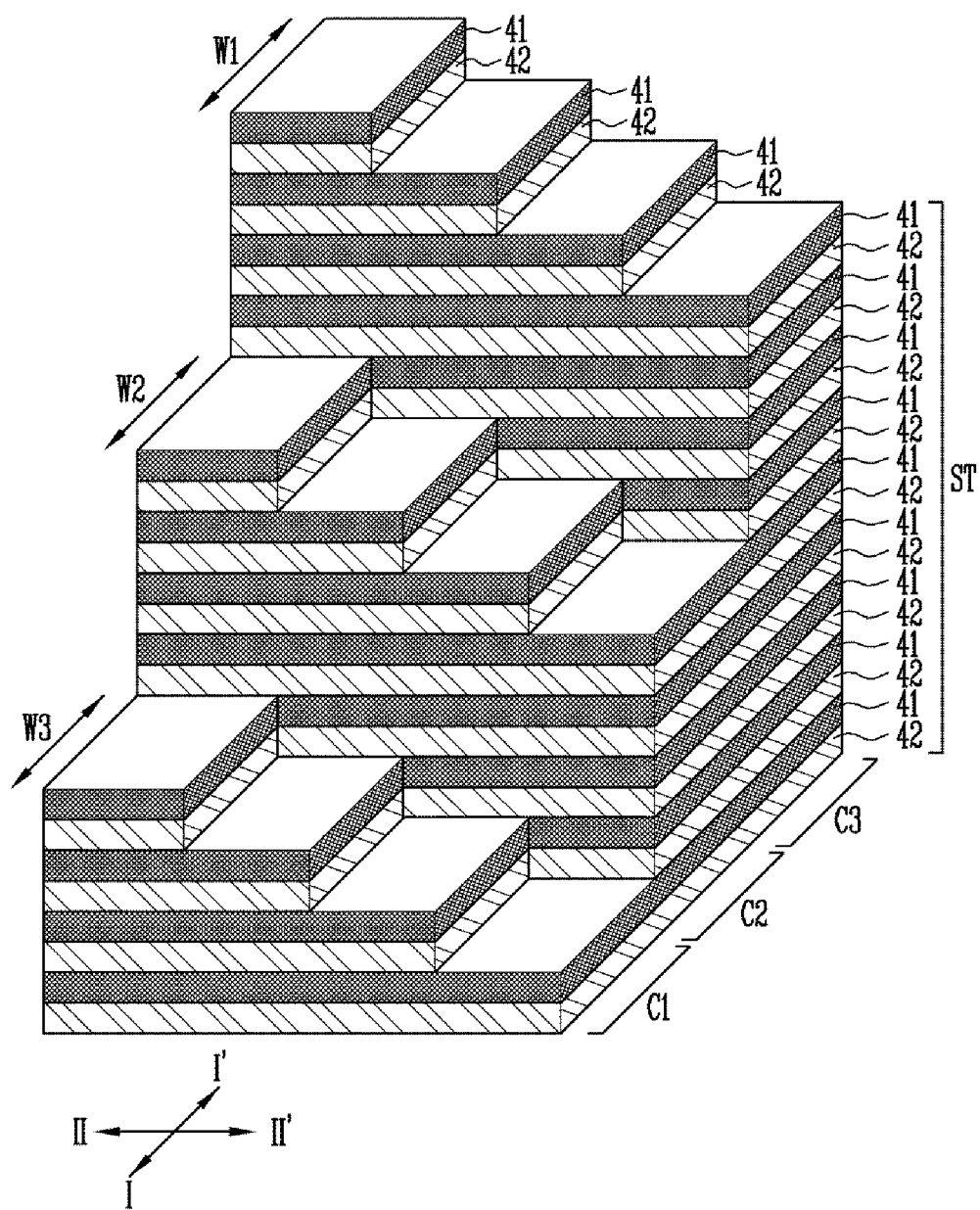

FIGS. 4 to 10B are views illustrating a representation of a method of manufacturing a semiconductor device according to an embodiment. FIGS. 4 and 5 are perspective views. FIGS. 6A to 10B are cross-sectional views taken along lines A-A', C-C' and D-D' of FIG. 2 or layout views.

Referring to FIG. 4, a stacked structure ST may be formed to include insulating layers 41 and sacrificial layers 42 stacked alternately with each other. The sacrificial layers 42 may be replaced by conductive layers during subsequent processes. The sacrificial layers 42 may include materials having a high etch selectivity with respect to the insulating layers 41. For example, the sacrificial layers 42 may include a nitride, and the insulating layers 41 may include an oxide.

Subsequently, after a mask pattern (not illustrated) is formed over the stacked structure ST, an etch process may be repeated while gradually reducing a size of the mask pattern in the second direction II-II'. As a result, a portion of a top surface of the stacked structure ST may be patterned stepwise. The stacked structure ST may be patterned so that a single insulating layer 41 and a single sacrificial layer 42 may form a single step.

Referring to FIG. 5, after the mask pattern (not illustrated) is formed over the stacked structure ST, an etch process may be repeated while gradually reducing a size of the mask pattern in the first direction I-I'. The stacked structure ST may be patterned so that M insulating layers 41 and M sacrificial layers 42 may form a single step. For example, M may be a natural number, and M=4 may be satisfied. Therefore, the stacked structure ST may be stepped in the first direction I-I' and the second direction II-II', and the first to third interconnection structures C1 to C3 may be defined. Widths W1, W2 and W3 of the first to third interconnection structures C1, C2 and C3, respectively, may be determined by the reduced size of the mask pattern. The first to third interconnection structures C1 to C3 may have substantially the same width (W1=W2=W3) or different widths (for example but not limited to, W1>W2>W3, W1<W2<W3, or a random combination thereof).

Figure 6A:
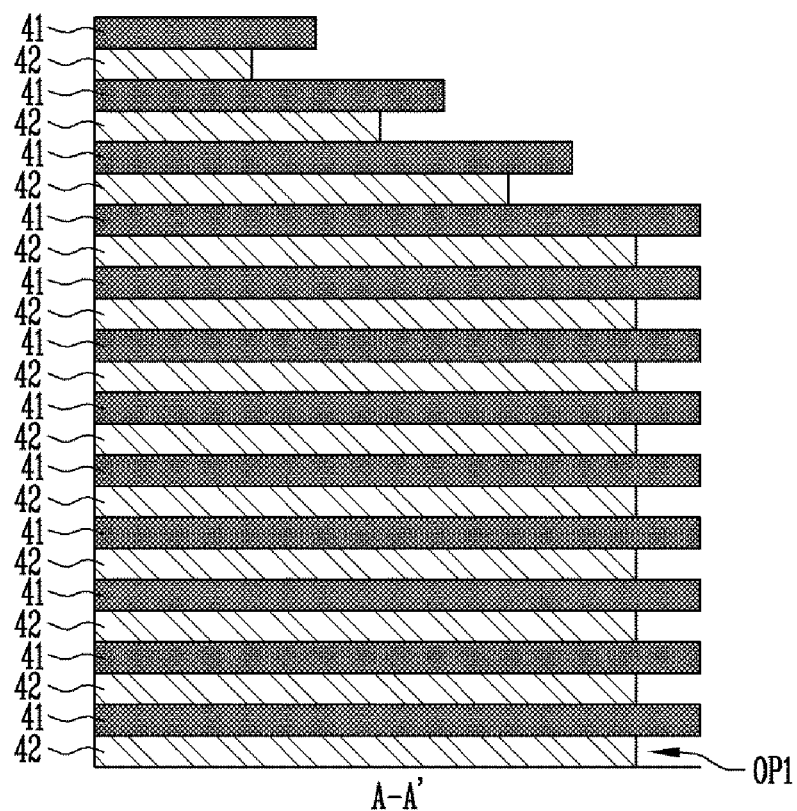
Figure 6B:
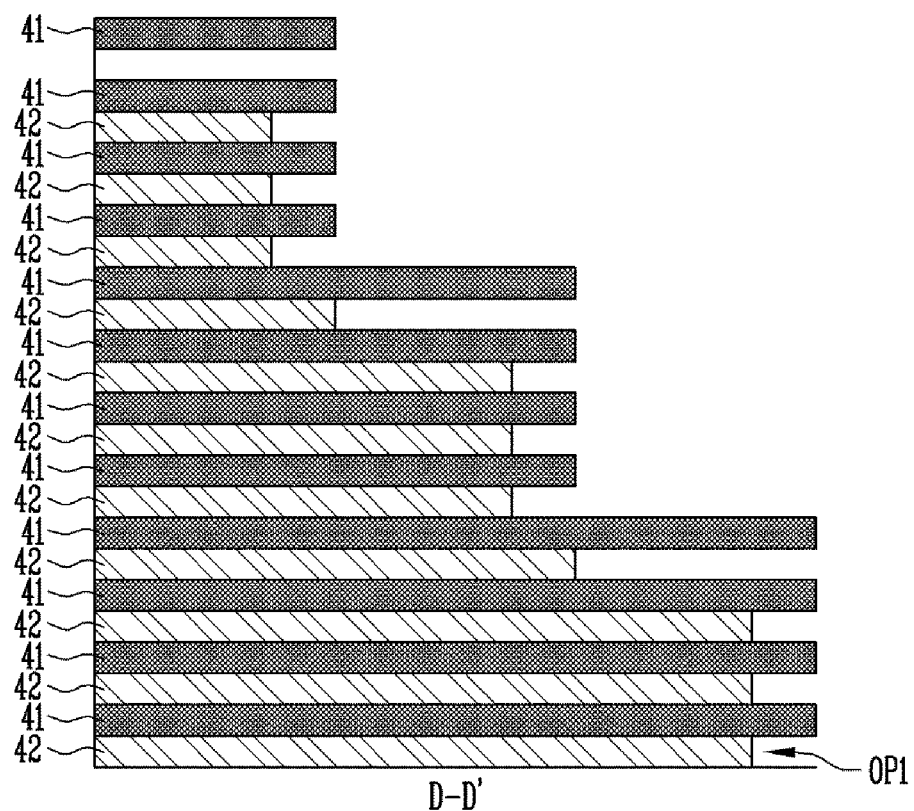
Figure 6C:
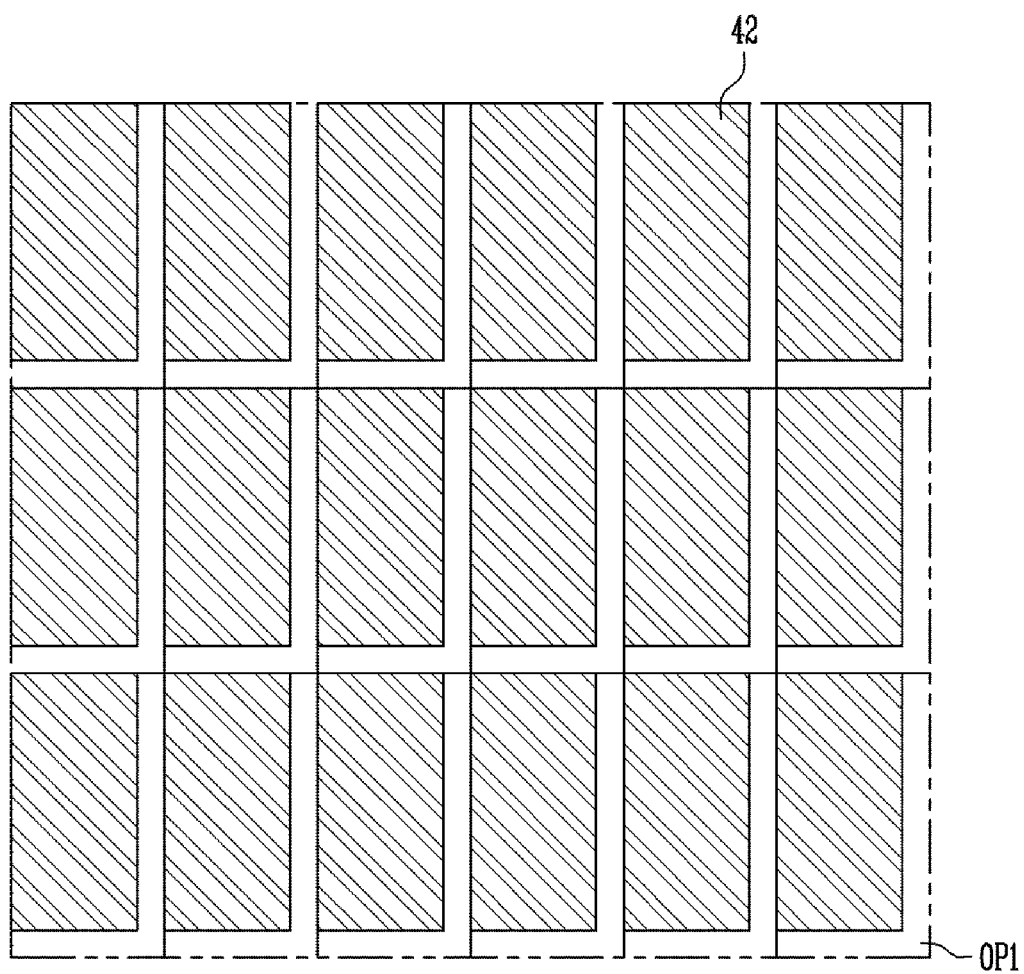

Referring to FIGS. 6A to 6C, first openings OP1 may be formed by partially removing the sacrificial layers 42 exposed on a sidewall of the stacked structure ST. For example, the sacrificial layers 42 may be removed by 400 to 600 Å. Since the sacrificial layers 42 are removed along the sidewall patterned stepwise, the sacrificial layers 42 may be removed in an L shape on the respective layers.

Figure 7A:
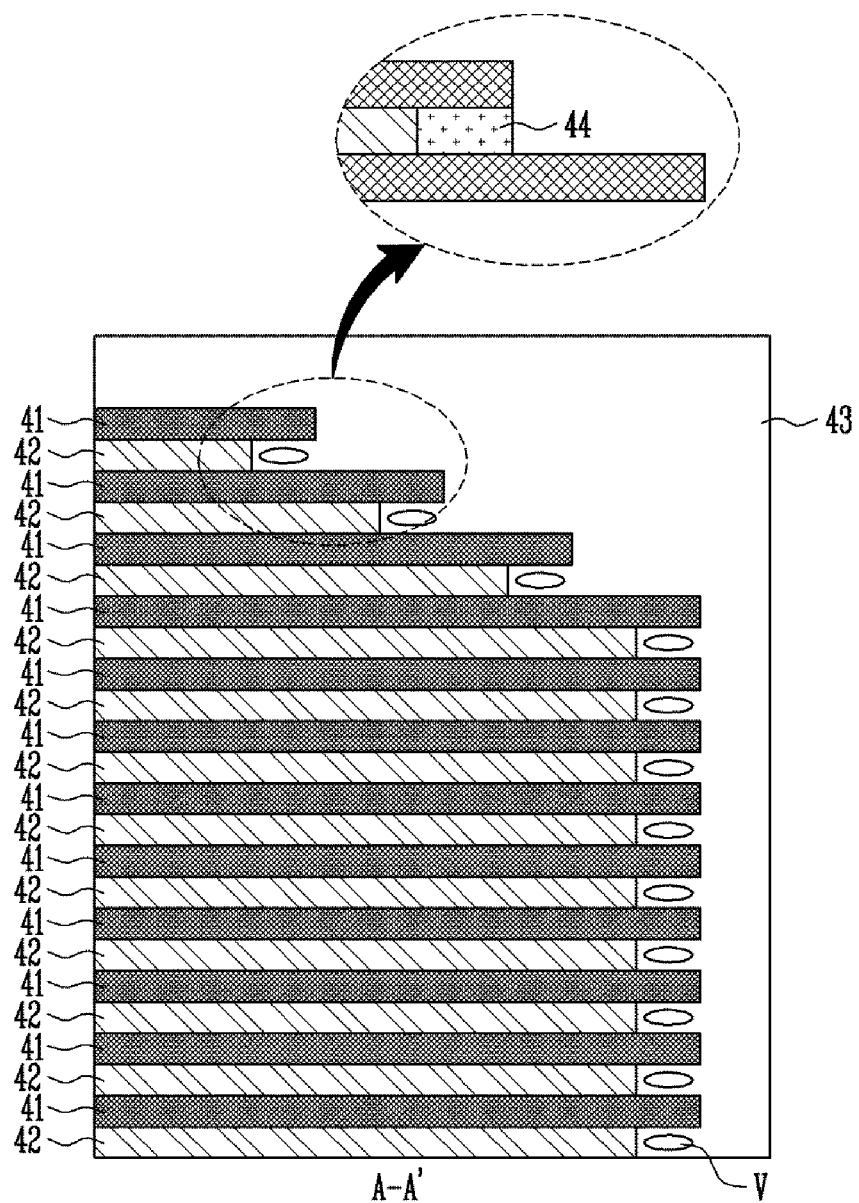
Figure 7B:
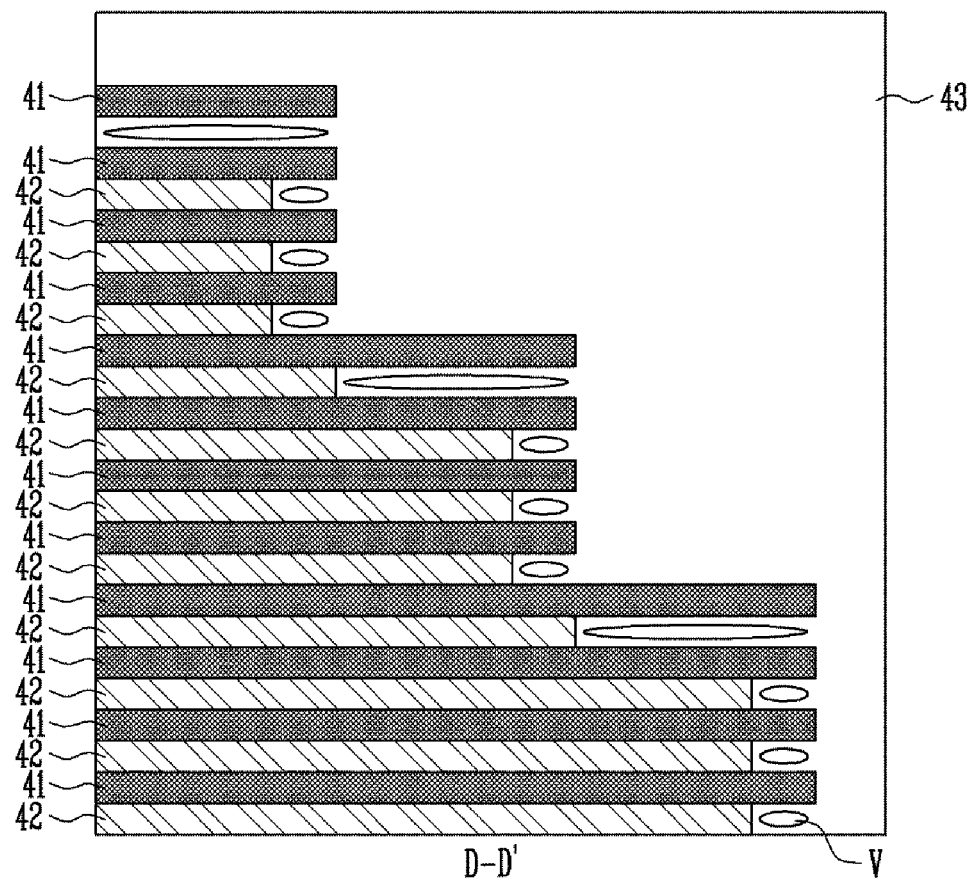
Figure 8A:
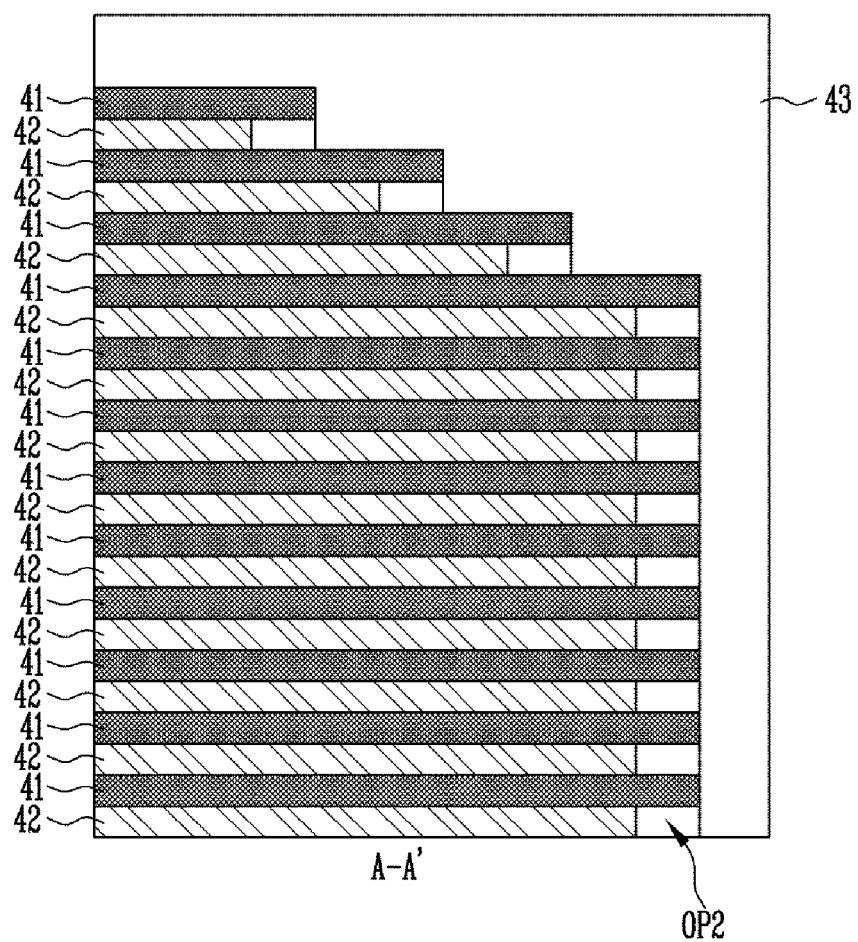
Figure 8C:
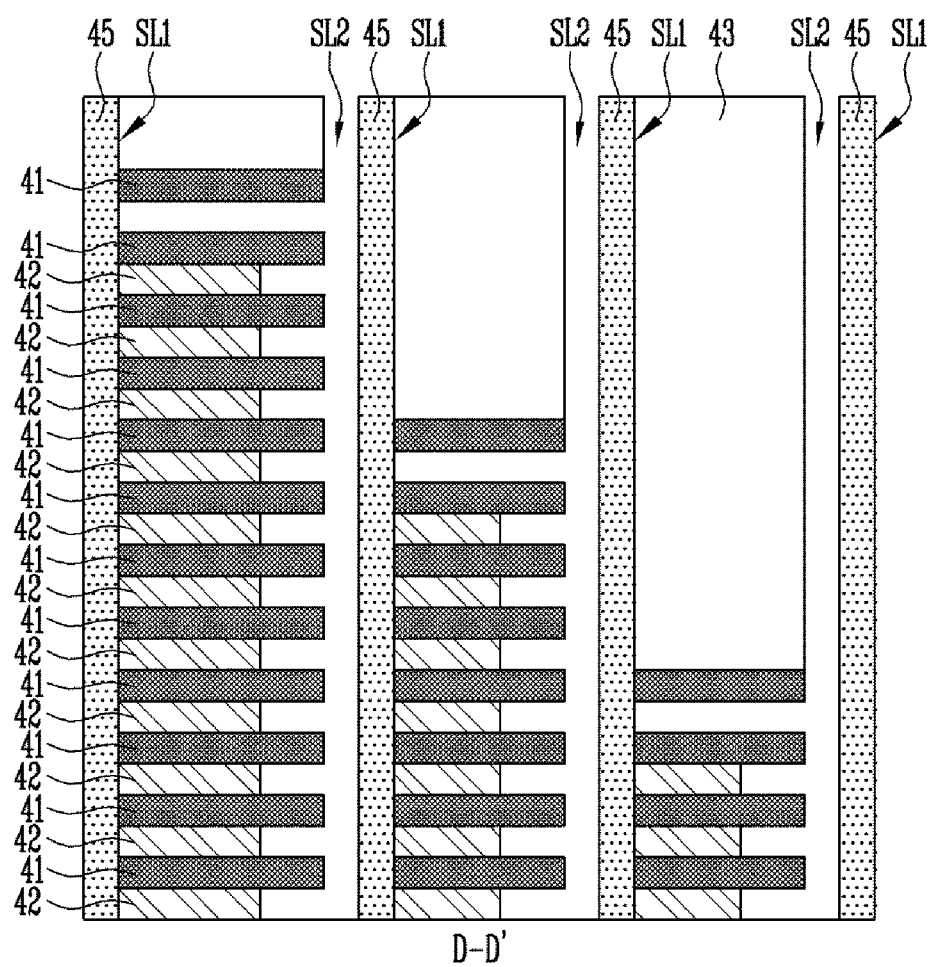
Figure 8D:
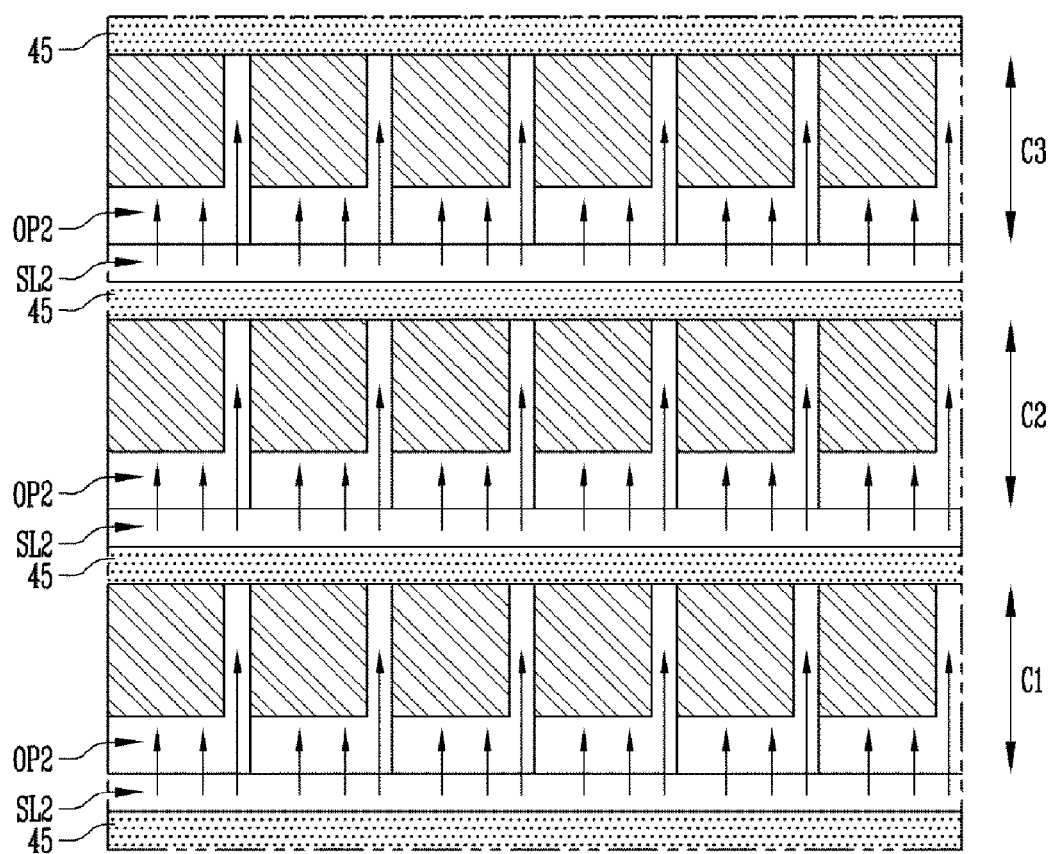

Referring to FIGS. 7A and 7B, an interlayer insulating layer 43 may be formed over the stacked structure ST. The first openings OP1 may be partially filled with the interlayer insulating layer 43. The interlayer insulating layer 43 may include voids V located in the first openings OP1.

Before the interlayer insulating layer 43 is formed, sacrificial patterns 44 having a higher etch rate than the sacrificial layers 42 may be formed in the first openings OP1. For example, the sacrificial patterns 44 may include an oxide, for example, an oxide layer formed by conformal deposition (CFD), an oxide layer formed by plasma enhanced-atomic layer deposition (PE-ALD), or an ultra low temperature oxide layer.

Referring to FIGS. 8A to 8D, after first slits SL1 are formed through the stacked structure ST, first slit insulating layers 45 may be formed in the first slits SL1. The first slit insulating layers 45 may be located between the neighboring interconnection structures C1 to C3.

Subsequently, second slits SL2 may be formed between the first slit insulating layers 45 and the interconnection structures C1 to C3. The second slits SL2 may be located on one set of sides of the first slits SL1. Therefore, the first slit insulating layers 45 may be exposed on one set of sidewalls of the second slits SL2, and the interconnection structures C1 to C3 may be located on the other set of sidewalls of the second slits SL2. In addition, the voids V of the interconnection structures C1 to C3 may be exposed on the other set of sidewalls of the second slits SL2.

Subsequently, the sacrificial layers 42 may be partially removed through the second slits SL2 and the voids V to form second openings OP2. For example, the sacrificial layers 42 may be removed by performing a wet etch process. During the wet etch process, an etchant may be introduced through the second slits SL2 and the voids V to partially etch the sacrificial layers 42. In addition, when the second openings OP2 are formed, the first slit insulating layer may function as a support body of the remaining insulating layers 41. As described above with reference to FIG. 7A, when the sacrificial patterns 44 are formed in the first openings OP1, since the sacrificial patterns 44 have a higher etch rate than the sacrificial layers 42, the sacrificial patterns 44 may provide a path through which the etchant is introduced, in a substantially similar manner as the voids V.

According to an embodiment, since the first slit insulating layers 45 are exposed on the one set of sidewalls of the second slits SL2, only the sacrificial layers 42 of the interconnection structures C1 to C3 located on the other set of sidewalls of the second slits SL2 may be removed. In other words, the second openings OP2 may have substantially an L shape.

Figure 9A:
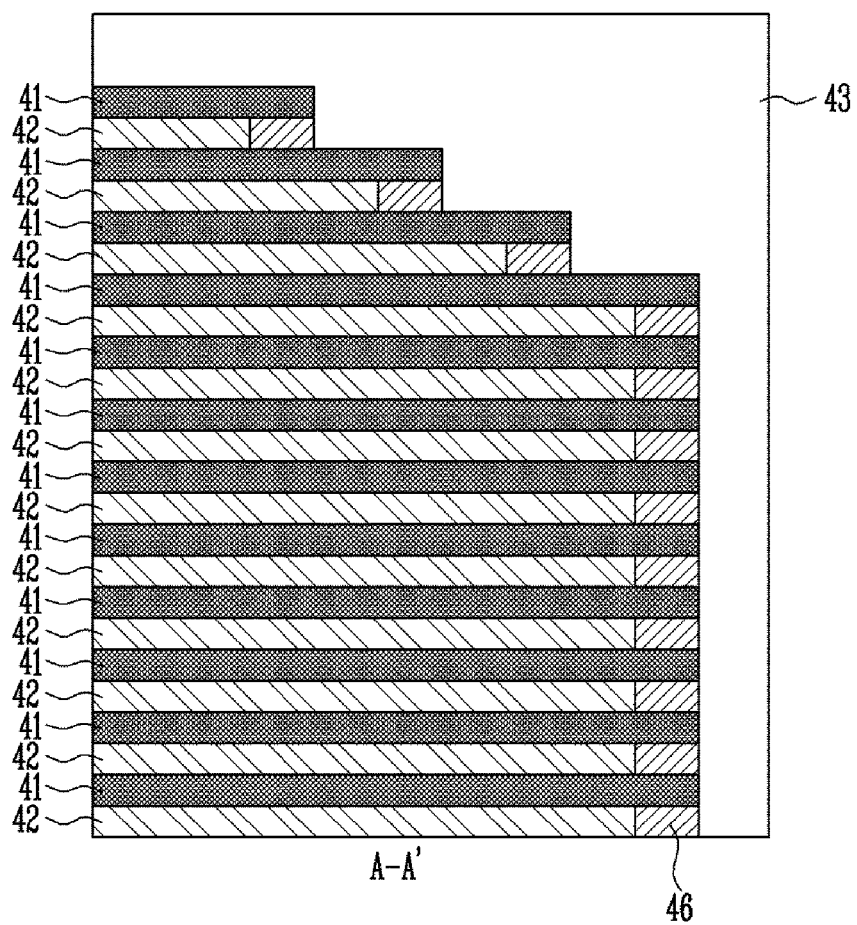
Figure 9B:
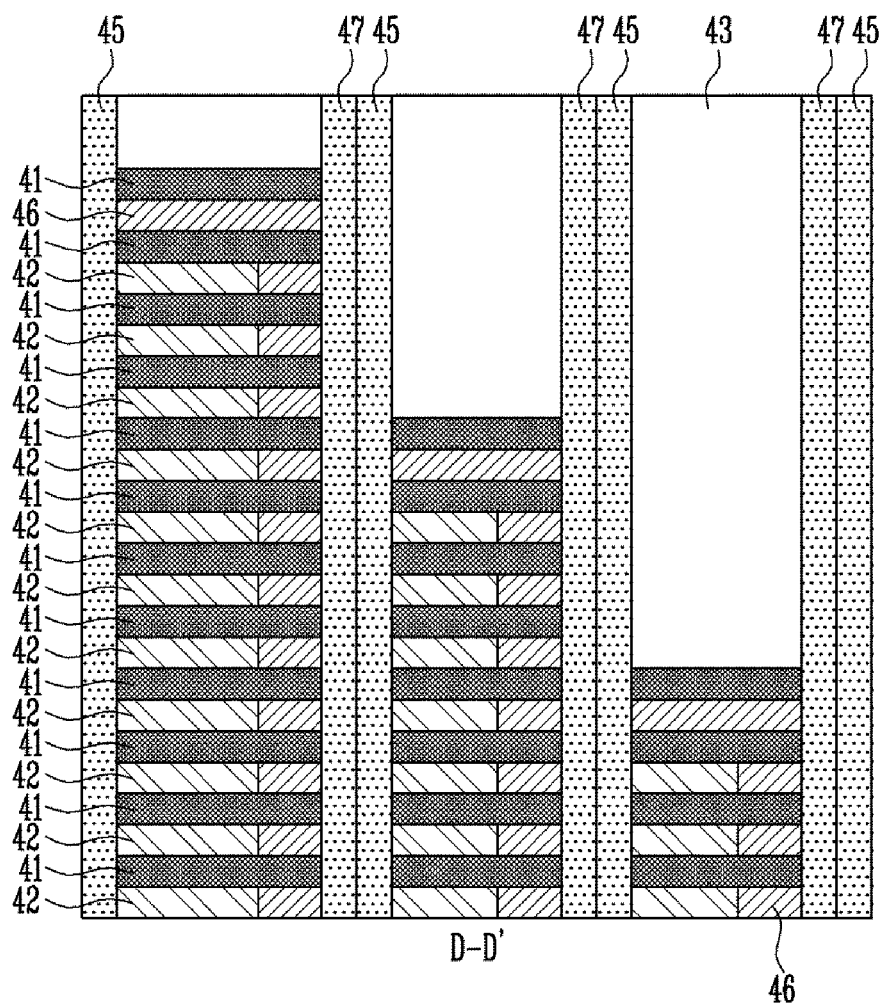

Referring to FIGS. 9A and 9B, after conductive layers 46 are formed in the second openings OP2, second slit insulating layers 47 may be formed in the second slits SL2. Therefore, the conductive layers 46 may have substantially an L shape. In addition, the sacrificial layers 42 which are not removed when the second openings OP2 are formed may remain in the interconnection structures C1 to C3.

Figure 10A:
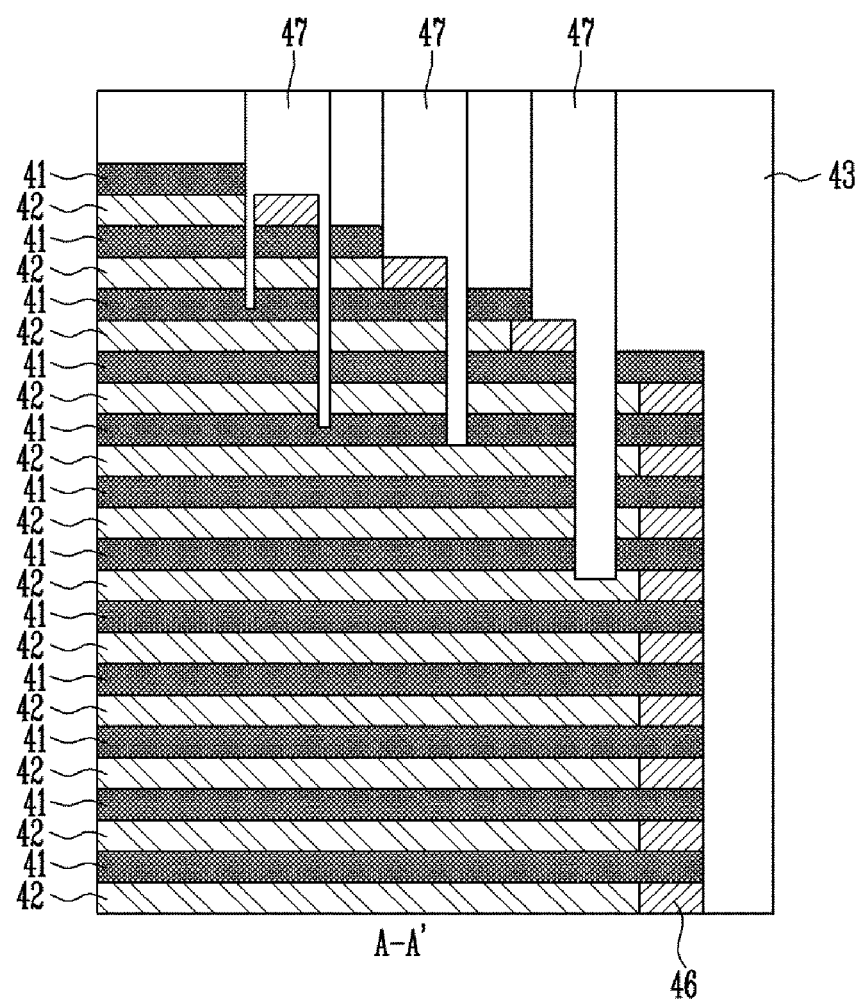
Figure 10B:
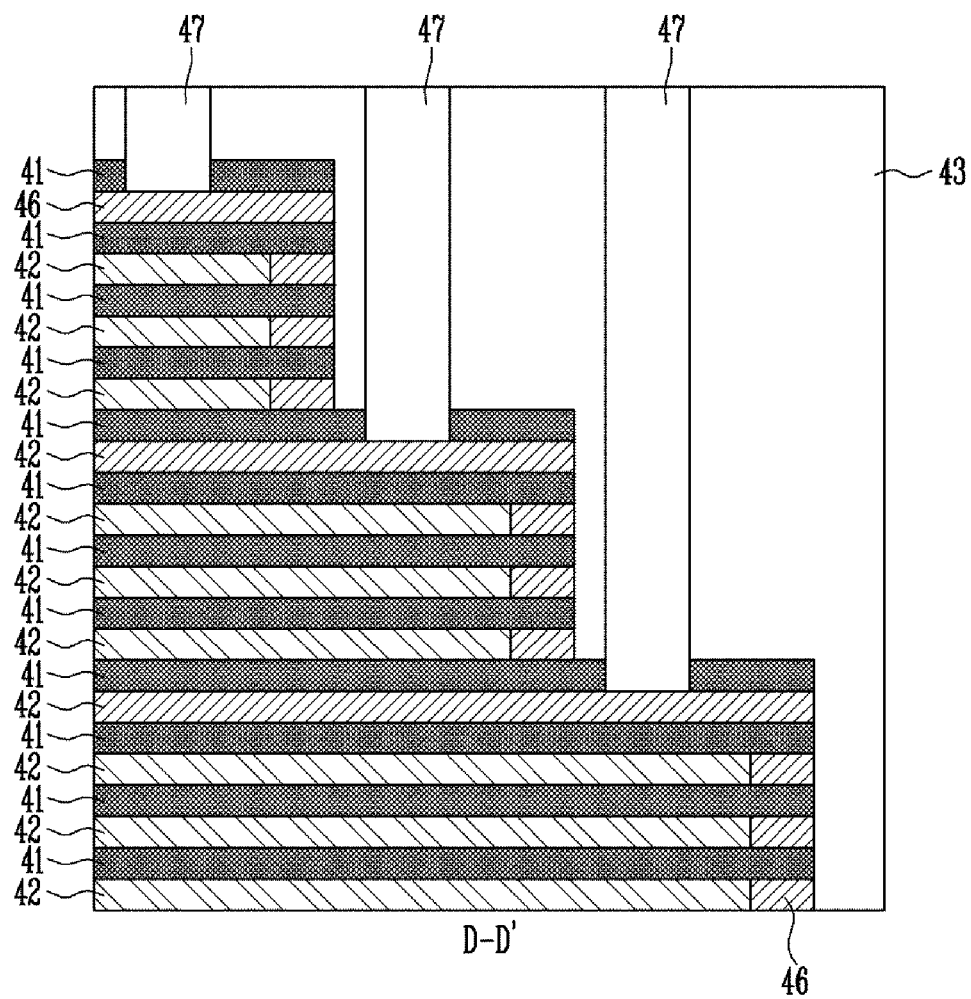

Referring to FIGS. 10A and 10B, contact plugs 47 may be formed so that the contact plugs 47 may be coupled to the conductive layers 46. The contact plugs 47 may contact top surfaces and sidewalls of the conductive layers 46 and at least partially pass through the lower insulating layers 41 and the lower sacrificial layers 42.

FIGS. 11A to 13B are diagrams illustrating a representation of a method of manufacturing a semiconductor device according to an embodiment. FIGS. 11A to 11C, FIGS. 12A and 12B, and FIGS. 13A and 13B are cross-sectional diagrams taken along lines A-A' and D-D' of FIG. 3B or layouts.

As described above with reference to FIGS. 4 to 7B, a stacked structure ST including insulating layers 51 and sacrificial layers 52 stacked alternately with each other, first openings OP1, and an interlayer insulating layer 53 including voids V located in the first openings OP1 may be sequentially formed. However, a description of the processes of forming the first slit SL1 and the first slit insulating layers 45 according to the earlier described embodiment is omitted.

Figure 11A:
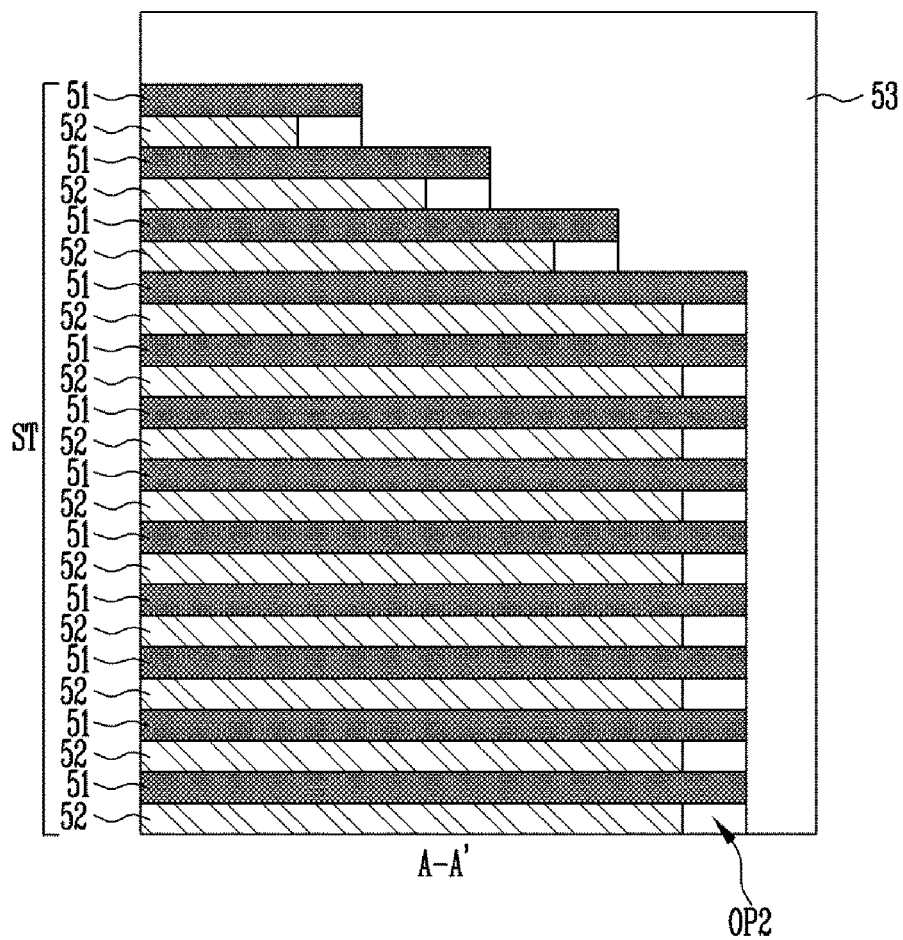
FIGS. 11A to 13B are layouts and cross-sectional diagrams illustrating representations of a method of manufacturing a semiconductor device according to an embodiment.
Figure 11B:
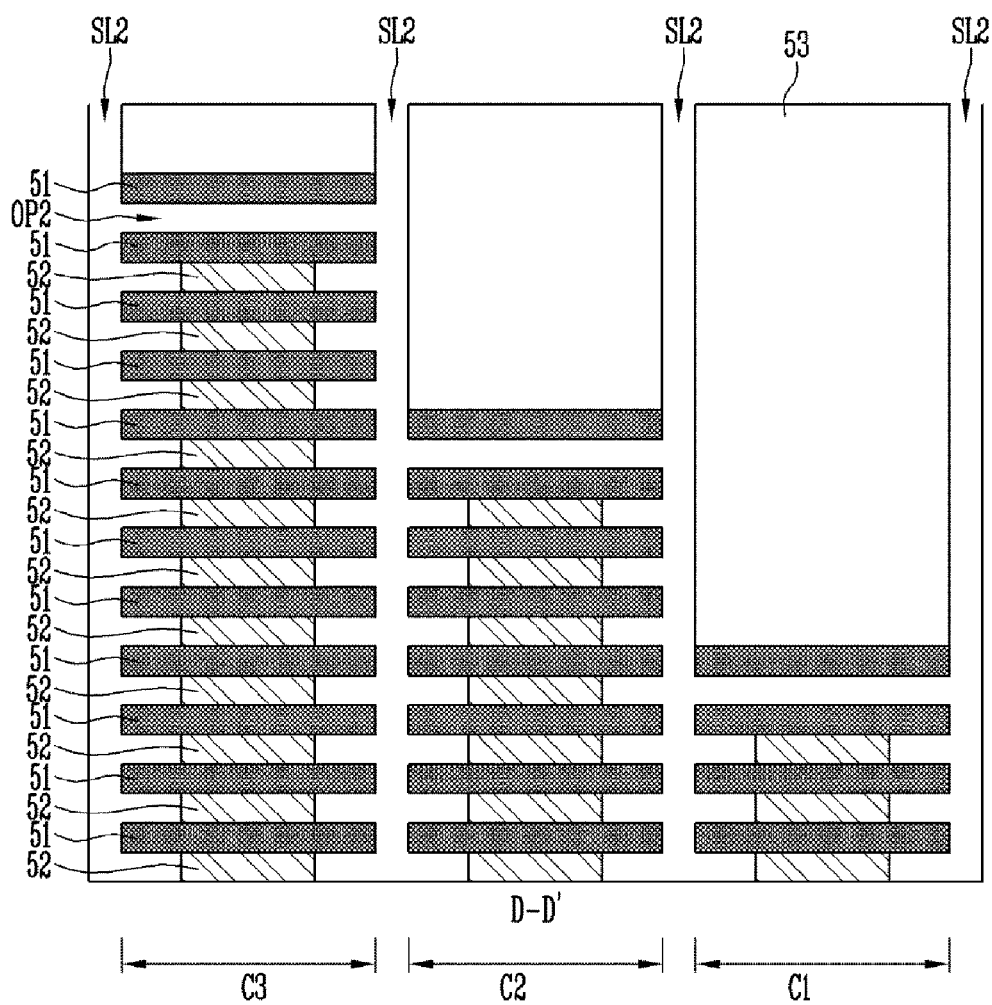
Figure 11C:
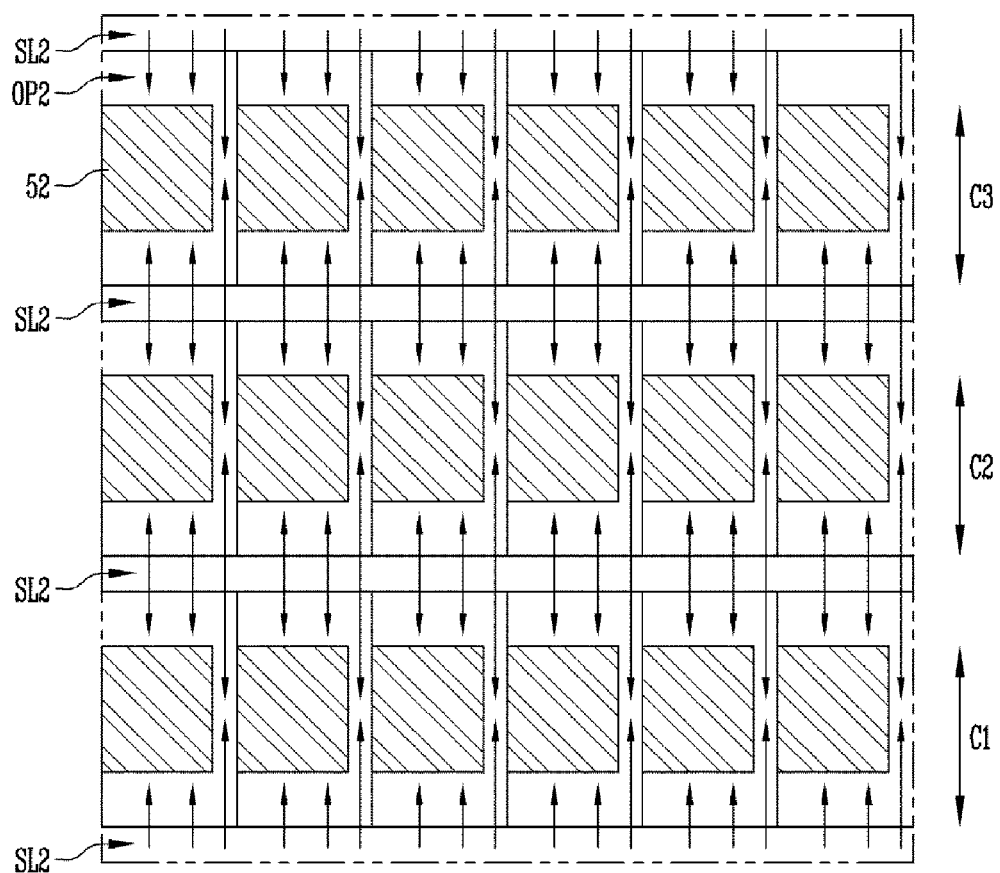

Referring to FIGS. 11A to 11C, the second slits SL2 may be formed through the stacked structure ST. For example, the second slits SL2 may be located between the neighboring interconnection structures C1 to C3, and the interconnection structures C1 to C3 at both sides of the second slits SL2 may be exposed on both sidewalls thereof.

Subsequently, the sacrificial layers 52 may be partially removed through the second slits SL2 and the voids V. Since the sacrificial layers 52 are removed on both sides of the second slits SL2, the second openings OP2 having substantially a C shape may be formed.

Figure 12A:
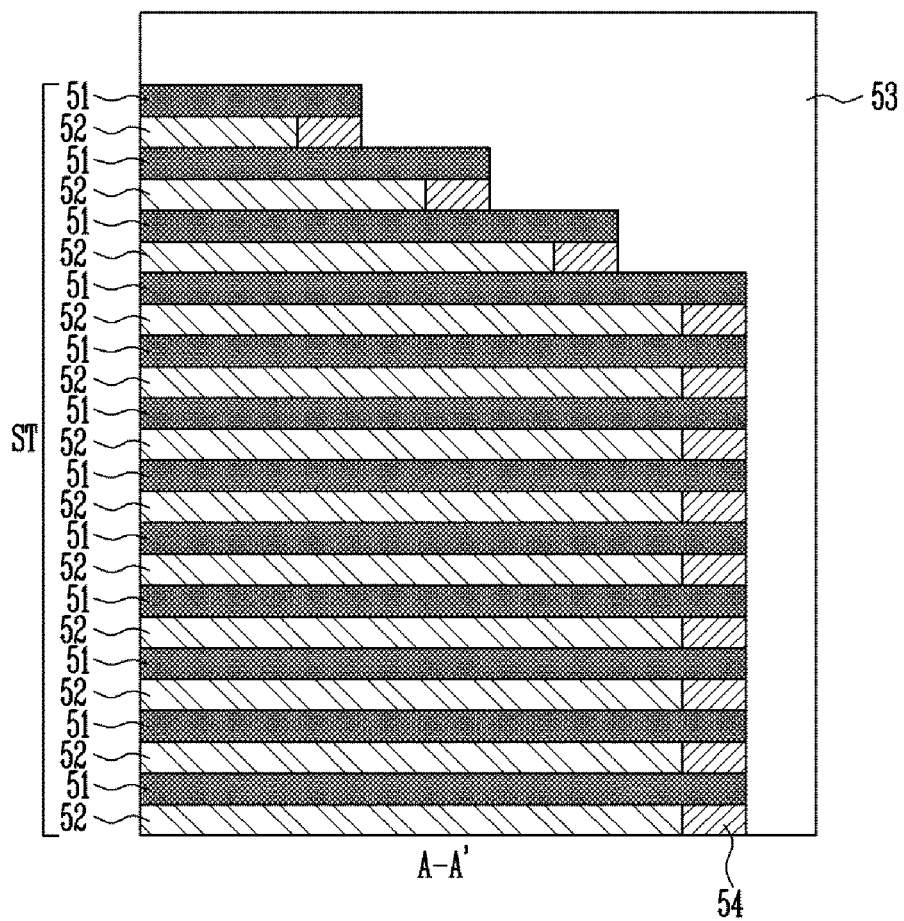
Figure 12B:
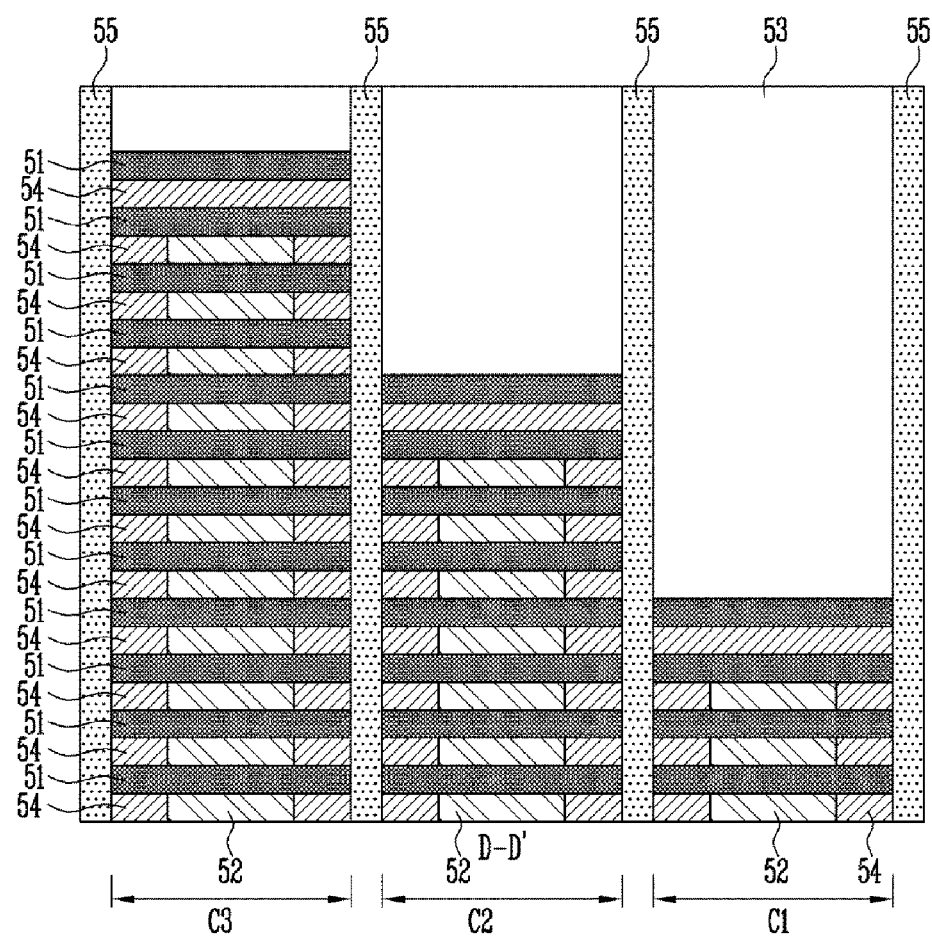

Referring to FIGS. 12A and 12B, conductive layers 54 may be formed in the second openings OP2. Each of the conductive layers 54 may have substantially a C shape. Subsequently, second slit insulating layers 55 may be formed in the second slits SL2. Therefore, the conductive layers 54 included in the neighboring interconnection structures C1 to C3 may be insulated from each other by the second slit insulating layers 55.

Figure 13A:
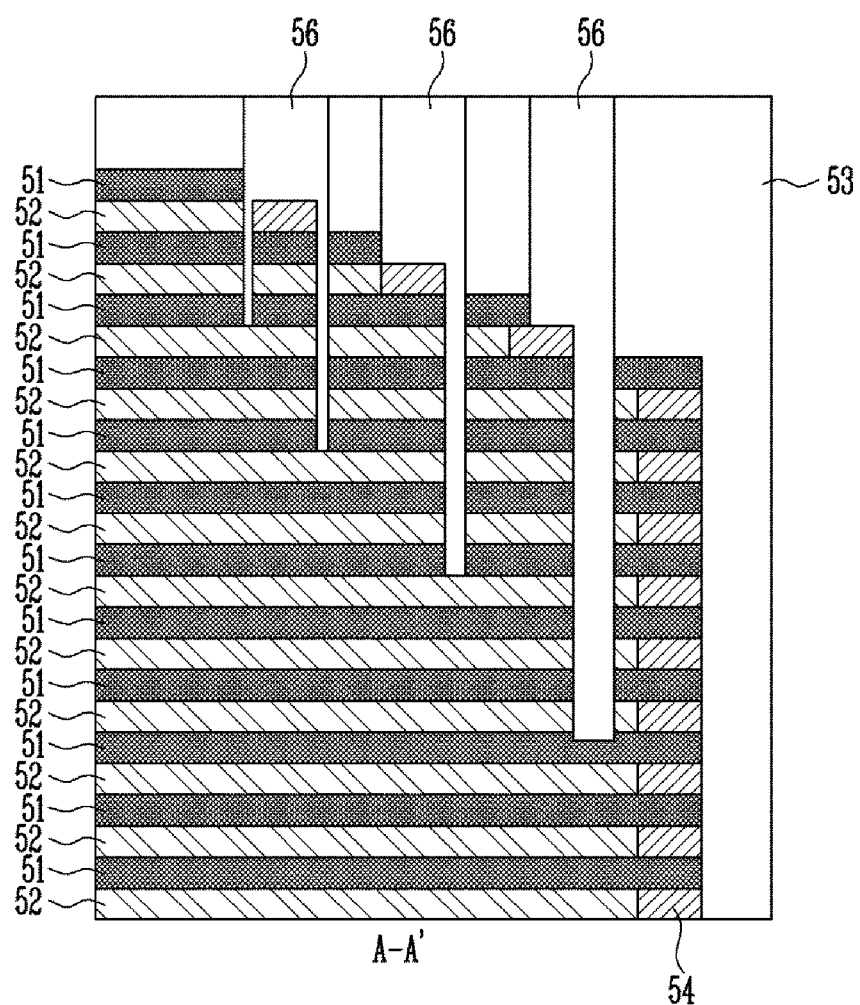
Figure 13B:
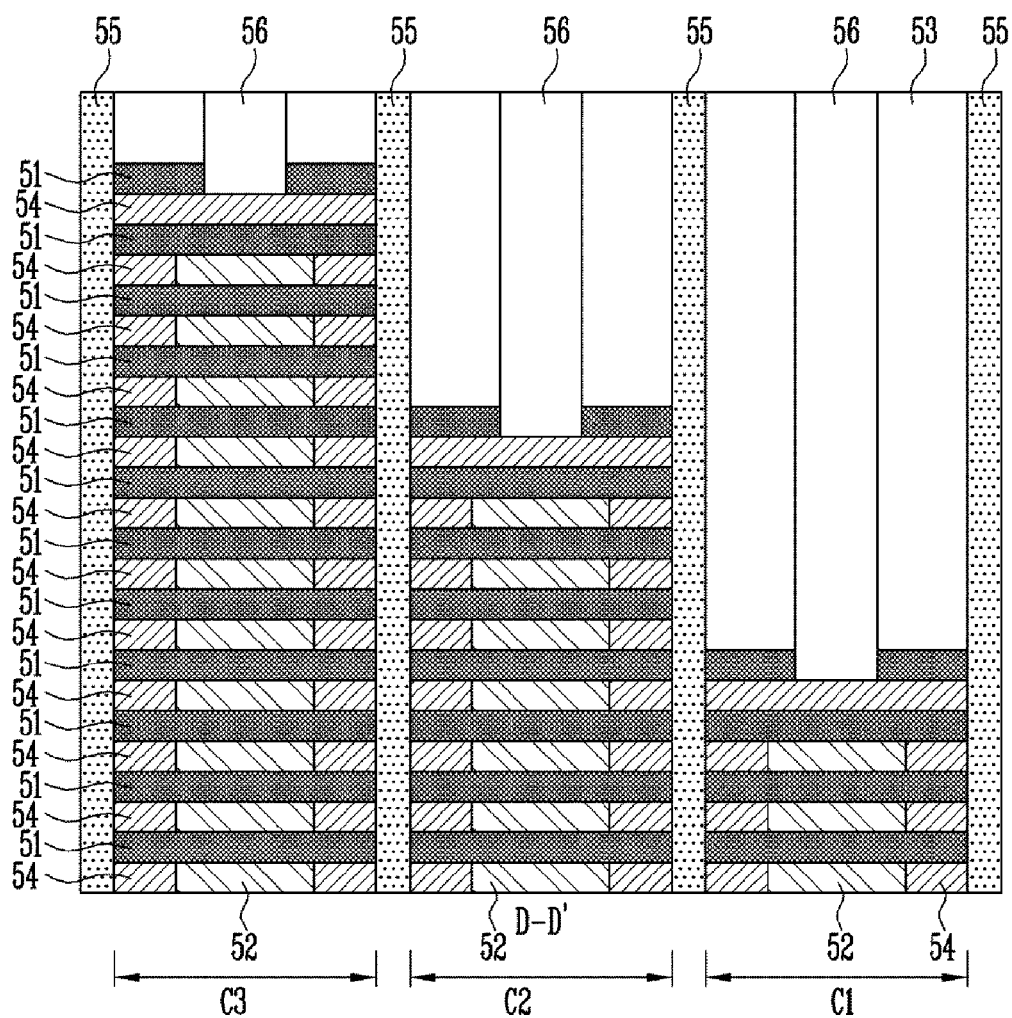

Referring to FIGS. 13A and 13B, contact plugs 56 may be formed so that the contact plugs 56 may contact the conductive layers 54 and at least partially pass through the lower insulating layers 41 and the lower sacrificial layers 42.

Figure 14A:
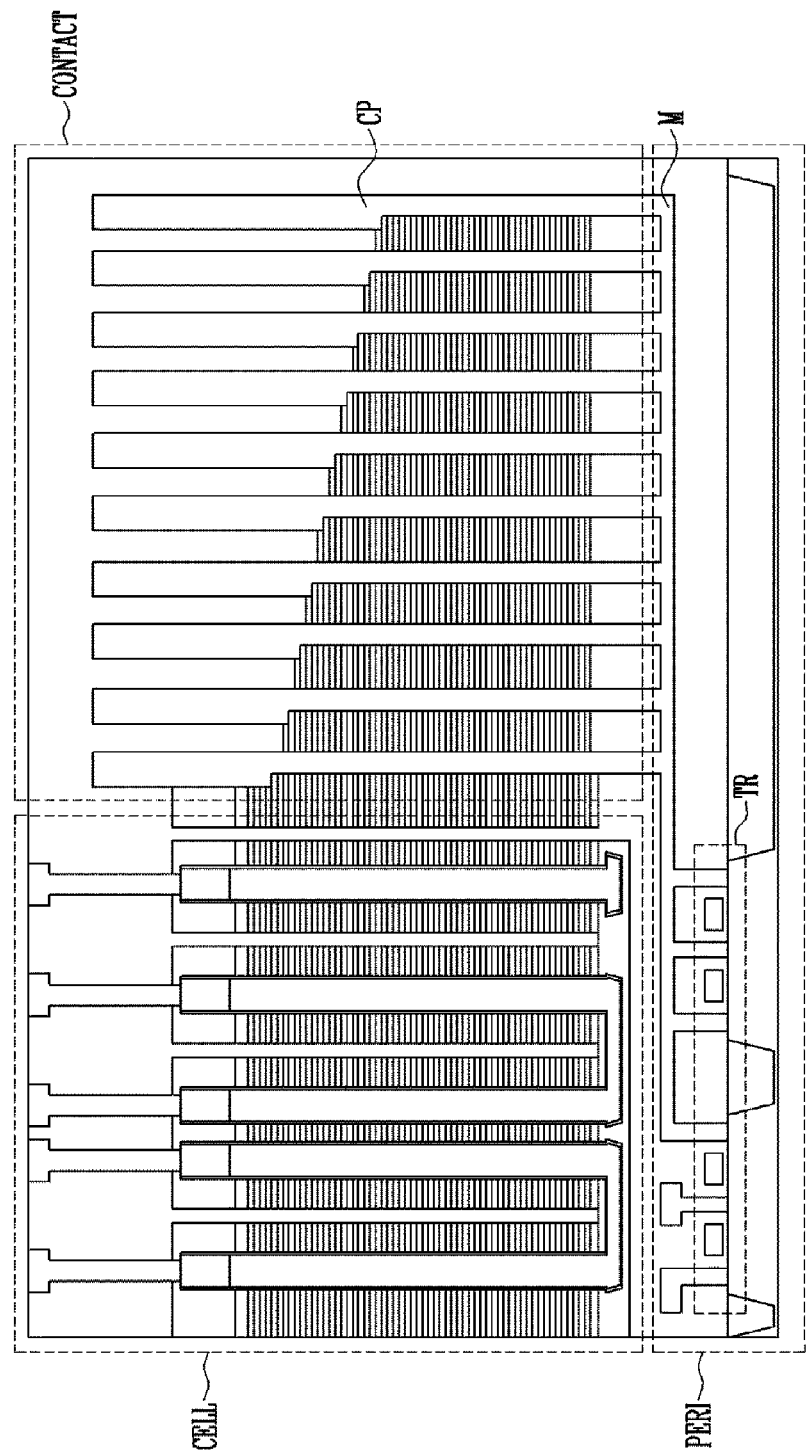
FIGS. 14A and 14B are cross-sectional diagrams illustrating representations of a semiconductor device to which an interconnection structure is applied according to an embodiment.
Figure 14B:
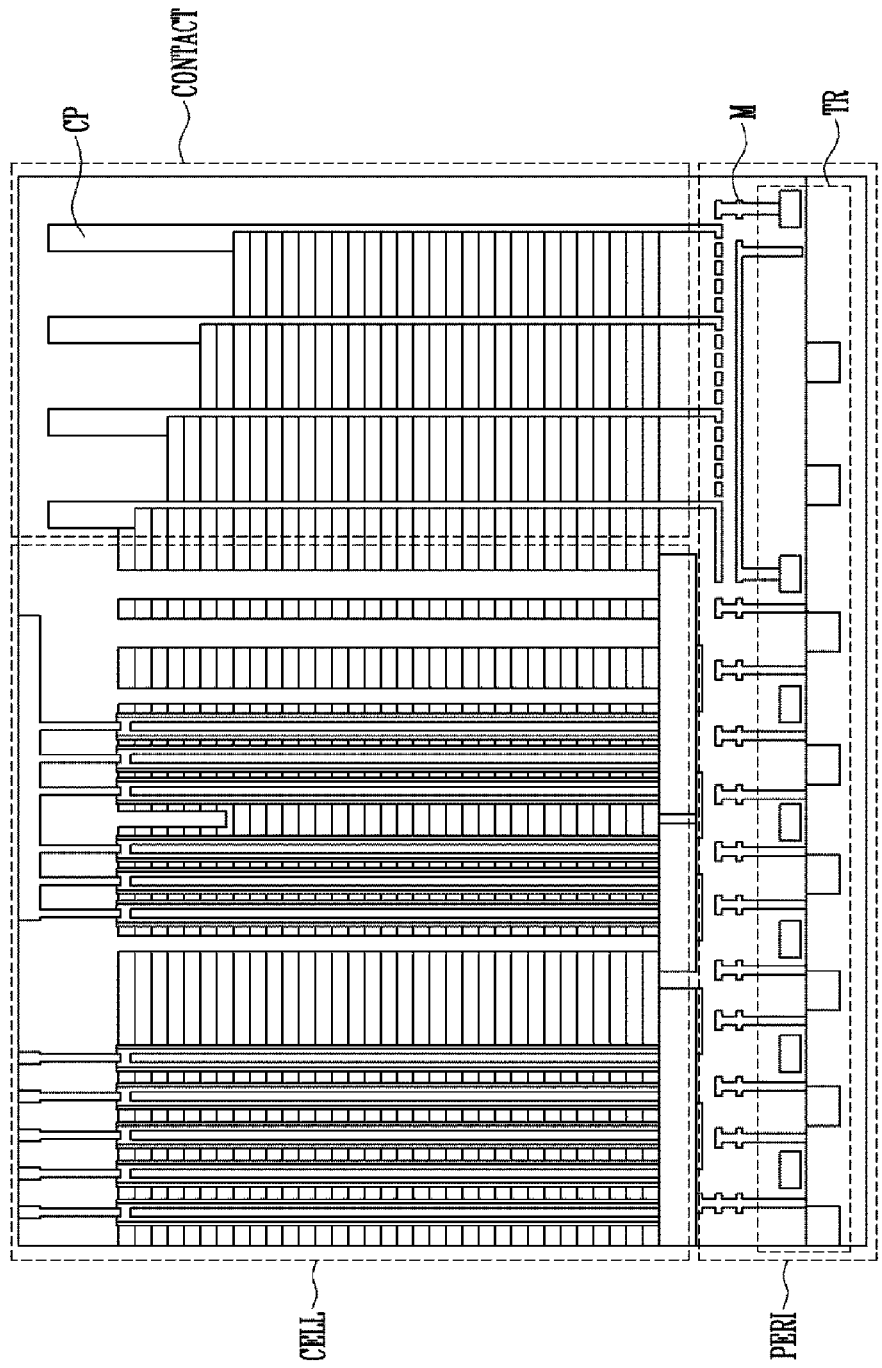

FIGS. 14A and 14B are cross-sectional diagrams illustrating a representation of a semiconductor device to which interconnection structures are applied according to an embodiment.

Referring to FIGS. 14A and 14B, a peripheral region PERI may be located under the cell region CELL and the contact region CONTACT. The cell region CELL may include memory cells stacked over a substrate, and memory strings may be arranged in a straight shape, a U shape or the like. FIG. 14A illustrates memory strings arranged in substantially a U shape. FIG. 14B illustrates memory strings arranged in substantially a straight shape.

The contact region CONTACT may include interconnection structures in which conductive layers having substantially a C shape or an L shape are stacked. Contact plugs may be coupled to the conductive layers, respectively. In addition, the contact plugs may pass through lower insulating layers and lower dielectric layers.

The peripheral region PERI may include transistors TR and metal lines M coupled to the transistors TR. The transistors TR may be provided to drive the memory strings. The transistors TR may be to couple transistors located in the peripheral region PERI to pads formed in the contact region CONTACT to each other. Therefore, according to an embodiment, the contact plugs CP may completely pass through the lower insulating layers and the lower dielectric layers and be coupled to the metal lines M in the peripheral region PERI. In the semiconductor device having the above structure, bias may be supplied to the transistors TR in the peripheral region PERI through the contact region CONTACT as well as to the gate electrodes of the cell region CELL. Therefore, separate contact plugs for providing bias to the transistors TR in the peripheral region may not be necessary, so that the area of the semiconductor device may be reduced.

Figure 15:
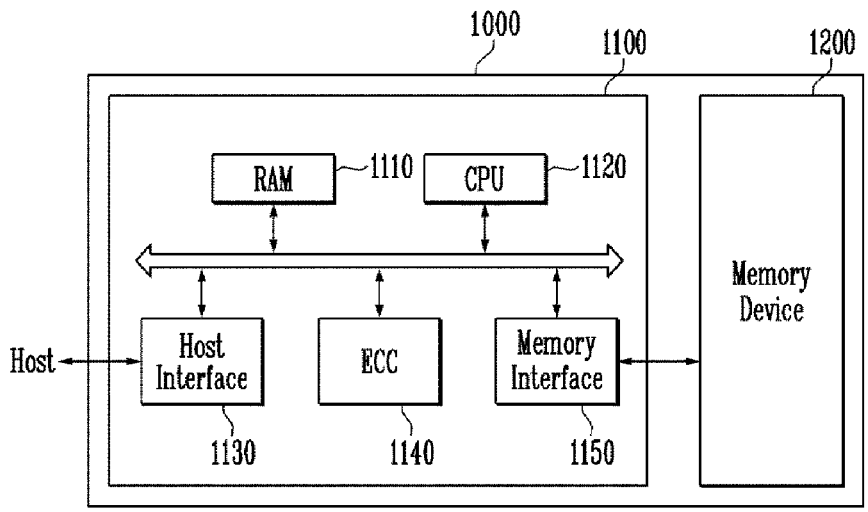
FIGS. 15 and 16 are block diagrams illustrating representations of the configuration of a memory system according to an embodiment.

FIG. 15 is a block diagram illustrating the configuration of a memory system according to an embodiment.

As illustrated in FIG. 15, a memory system 1000 according to an embodiment may include a memory device 1200 and a controller 1100.

The memory device 1200 may be used to store data information including various types of data such as text, graphic and software codes. The memory device 1200 may be a non-volatile memory and may be, for example, the semiconductor device described above with reference to FIGS. 1A to 14. In addition, the memory device 1200 may include insulating layers stacked stepwise and dielectric layers interposed between the insulating layers. The memory device 1200 may include conductive layers interposed between the insulating layers and surrounding sidewalls of the dielectric layers, respectively. The memory device 1200 may include contact plugs each coupled to one of the conductive layers and at least partially passing through the insulating layers and the dielectric layers at a lower part. Since the memory device 1200 is configured and manufactured as described above, a detailed description thereof will be omitted.

The controller 1100 may be connected to a host and the memory device 1200 and may be suitable for accessing the memory device 1200 in response to a request from the host. For example, the controller 1100 may be suitable for controlling read, write, erase and background operations of the memory device 1200.

The controller 1100 may include random access memory (RAM) 1110, a central processing unit (CPU) 1120, a host interface 1130, an error correction code (ECC) 1140, and a memory interface 1150.

The RAM 1110 may be used as an operation memory, a cache memory between the memory device 1200 and the host, and a buffer memory between the memory device 1200 and the host. The RAM 1110 may be replaced by an SRAM (Static Random Access Memory), a ROM (Read Only Memory) or the like.

The CPU 1120 may be suitable for controlling the overall operation of the controller 1100. For example, the CPU 1120 may be suitable for operating firmware such as an FTL (Flash Translation Layer) stored in the RAM 1110.

The host interface 1130 may be suitable for performing interfacing with the host. For example, the controller 1100 may communicate with the host through at least one of various protocols such as USB (Universal Serial Bus) protocol, MMC (MultiMedia Card) protocol, PCI (Peripheral Component Interconnection) protocol, PCI-E (PCI-Express) protocol, ATA (Advanced Technology Attachment) protocol, Serial-ATA protocol, Parallel-ATA protocol, SCSI (Small Computer Small Interface) protocol, ESDI (Enhanced Small Disk Interface) protocol, IDE (Integrated Drive Electronics) protocol and private protocol.

The ECC circuit 1140 may be suitable for detecting and correcting errors in data read from the memory device 1200 using the ECC.

The memory interface 1150 may be suitable for performing interfacing with the memory device 1200. For example, the memory interface 1150 may include a NAND interface or a NOR interface.

The controller 1100 may further include a buffer memory (not illustrated) in order to store data temporarily. Here, the buffer memory may be used to temporarily store data delivered to outside through the host interface 1130, or to temporarily store data delivered from the memory device 1200 through the memory interface 1150. In addition, the controller 1100 may further include a ROM to store code data for interfacing with the host.

As described above, since the memory system 1000 according to an embodiment includes the memory device 1200 having improved characteristics, characteristics of the memory system 1000 may be improved.

Figure 16:
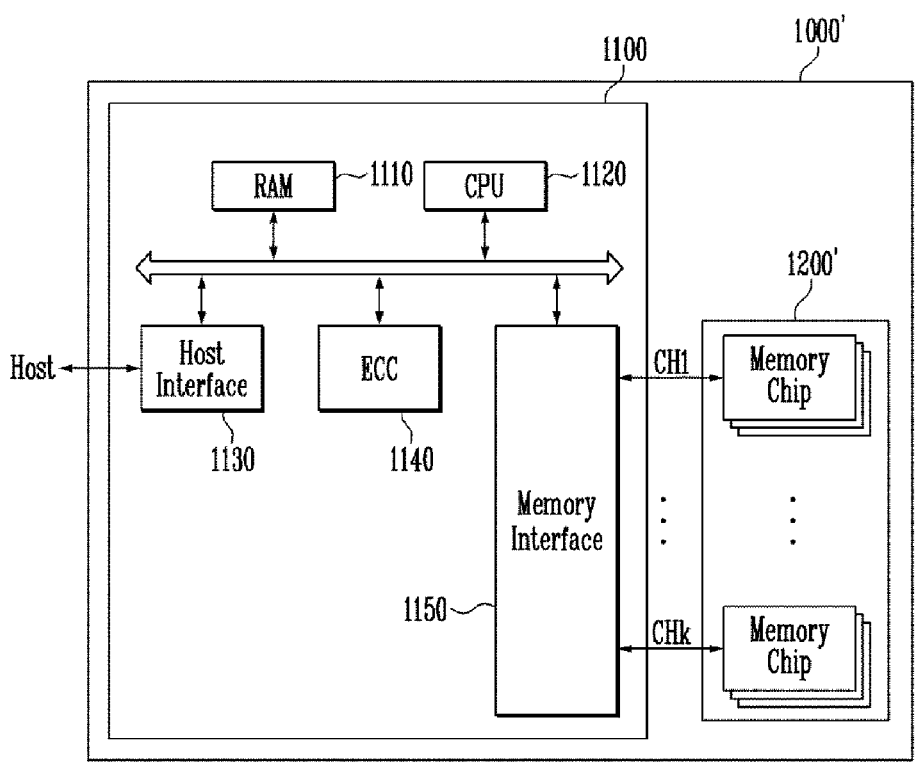

FIG. 16 is a block diagram illustrating the configuration of a memory system according to an embodiment. Hereinafter, a description of common contents with earlier described embodiments is omitted.

As illustrated in FIG. 15, the memory system 1000 according to an embodiment may include a memory device 1200' and the controller 1100. In addition, the controller 1100 may include a RAM 1110, a CPU 1120, a host interface 1130, an ECC circuit 1140 and a memory interface 1150.

The memory device 1200' may be a non-volatile memory and may be, for example, the semiconductor device described above with reference to FIGS. 1A to 14. In addition, the memory device 1200' may include insulating layers stacked stepwise and dielectric layers interposed between the insulating layers. The memory device 1200' may include conductive layers interposed between the insulating layers and surrounding sidewalls of the dielectric layers, respectively. The memory device 1200' may include contact plugs each coupled to one of the conductive layers and at least partially passing through the insulating layers and the dielectric layers at a lower part. Since the memory device 1200' is configured and manufactured as described above, a detailed description thereof will be omitted.

In addition, the memory device 1200' may be a multi-chip package including a plurality of the memory chips. The plurality of memory chips may be divided into a plurality of groups, and the plurality of groups may be suitable for communicating with the controller 1100 through first to k-th channel CH1 to CHk. The memory chips belonging to one group may be suitable for communicating with the controller 1100 through a common channel. The memory system 1000' may be modified so that a single memory chip may be coupled to a single channel.

As described above, since the memory system 1000' according to an embodiment includes the memory device 1000' having improved characteristics, characteristics of the memory system 1000' may also be improved. By forming the memory device 1200' as a multi-chip package, data storage capacity and driving speed of the memory system 1000' may be increased.

Figure 17:
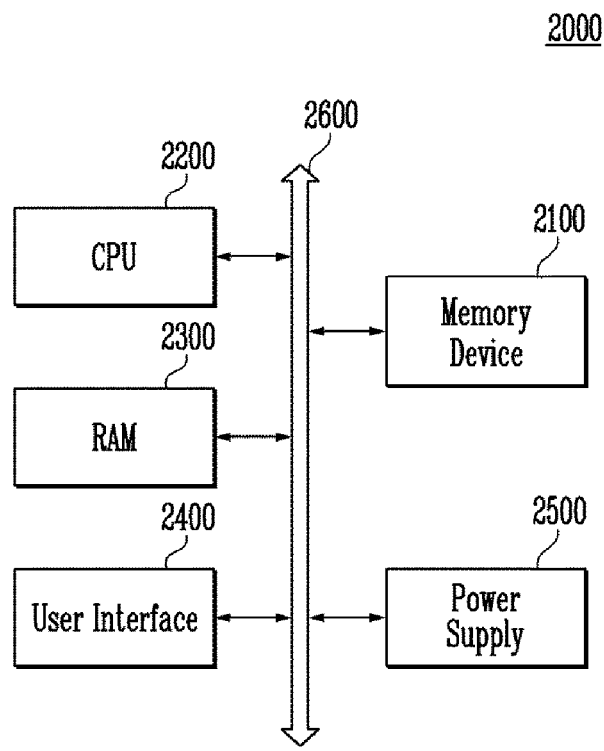
FIGS. 17 and 18 are block diagrams illustrating representations of the configuration of a computing system according to an embodiment.

FIG. 17 is a block diagram illustrating the configuration of a computing system according to an embodiment. Hereinafter, a description of common contents with earlier described embodiments is omitted.

As illustrated in FIG. 17, a computer system 2000 according to an embodiment may include a memory device 2100, a CPU 2200, and a RAM 2300. The computer system 2000 may include a user interface 2400, a power supply 2500 and a system bus 2600.

The memory device 2100 may store data provided through the user interface 2400 and data processed by the CPU 2200. The memory device 2100 may be electrically connected to the CPU 2200, the RAM 2300, the user interface 2400 and the power supply 2500 through the system bus 2600. For example, the memory device 2100 may be connected to the system bus 2600 through a controller (not illustrated) or directly connected to the system bus 2600. When the memory device 2100 is directly connected to the system bus 2600, functions of the controller may be performed by the CPU 2200 and the RAM 2300.

The memory device 2100 may be a non-volatile memory and may be, for example, the semiconductor device described above with reference to FIGS. 1A to 14. The memory device 2100 may include insulating layers stacked stepwise and dielectric layers interposed between the insulating layers. The memory device 2100 may include conductive layers interposed between the insulating layers and surrounding sidewalls of the dielectric layers, respectively. The memory device 2100 may include contact plugs each coupled to one of the conductive layers and at least partially passing through the insulating layers and the dielectric layers at a lower part. Since the memory device 2100 is configured and manufactured as described above, a detailed description thereof will be omitted.

In addition, the memory device 2100 may be a multi-chip package configured by a plurality of memory chips as described with reference to FIG. 16.

The computer system 2000 having such a configuration may be a computer, a UMPC (Ultra Mobile PC), a workstation, a net-book, a PDA (Personal Digital Assistant), a portable computer, a web tablet, a wireless phone, a mobile phone, a smart phone, an e-book, a PMP (Portable Multimedia Player), a portable game console, a navigation device, a black box, a digital camera, a 3-dimensional television, a digital audio recorder, a digital audio player, a digital picture recorder, a digital picture player, a digital video recorder, a digital video player, a device for wirelessly sending and receiving information, at least one of various electronic devices configuring a home network, at least one of various electronic devices configuring a computer network, at least one of various electronic devices configuring a telematics network and an RFID device.

As described above, since the computing system 2000 according to an embodiment includes the memory device 2100 having improved characteristics, data storage capacity of the computing system 2000 may be improved.

Figure 18:
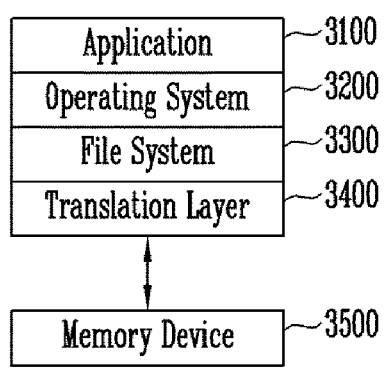

FIG. 18 is a block diagram illustrating a computing system according to an embodiment.

As illustrated in FIG. 18, a computing system 3000 according to an embodiment may include a software layer having an operating system 3200, an application 3100, and a file system 3300. The computing system 300 may include a translation layer 3400, and a hardware layer such as a memory device 3500.

The operating system 3200 may manage software resources and hardware resources of the computer system 3000 and control program execution by the CPU. The application 3100 may be various application programs executed in the computer system 3000 and may be a utility performed by the operating system 3200.

The file system 3300 may refer to a logical structure to manage data and files which exist in the computer system 3000. The file system 3300 may organize files or data to be stored in the memory device 3500 according to rules. The file system 3300 may be determined by the operating system 3200 used in the computer system 3000. For example, when the operating system 3200 is Microsoft Windows, the file system 3300 may be File Allocation Table (FAT) or NT File System (NTFS). In addition, when the operating system 3200 is Unix/Linux, the file system 3300 may be Extended File System (EXT), Unix File System (UFS) or Journaling File System (JFS).

In FIG. 18, the operating system 3200, the application 3100 and a file system 3300 are illustrated as separate blocks. However, the application 3100 and the file system 3300 may be included in the operating system 3200.

The translation layer 3400 may translate an address into an appropriate type for the memory device 3500 in response to a request from the file system 3300. For example, the translation layer 3400 may translate a logical address created by the file system 3300 into a physical address of the memory device 3500. Mapping information of the logical address and the physical address may be stored in an address translation table. For example, the translation layer 3400 may be a Flash Translation Layer (FTL) or a Universal Flash Storage Link Layer (ULL).

The memory device 3500 may be a non-volatile memory and may be, for example, the semiconductor device described above with reference to FIGS. 1A to 14. In addition, the memory device 3500 may include first semiconductor patterns including protrusions formed on sidewalls thereof and second semiconductor patterns coupled to the first semiconductor patterns and having a width increasing in width from bottom to top. Since the memory device 3500 is configured and manufactured as described above, a detailed description thereof will be omitted.

The computer system 3000 having this configuration may be separated into an operating system layer performed in the upper level region and a controller layer performed in the lower level region. The application 3100, the operating system 3200 and the file system 3300 may be included in the operating system layer and may be driven by an operating memory of the computer system 3000. In addition, the translation layer 3400 may be included in the operating system layer or in the controller layer.

As described above, since the computing system 3000 according to an embodiment includes the memory device 3500 having improved characteristics, data storage capacity of the computing system 3000 may also be improved.

A contact plug forming process may be easier to perform, and a bridge may be prevented from being formed between stacked conductive layers.

What is claimed is:

1. An interconnection structure, comprising:
   insulating layers stacked stepwise;
   dielectric layers interposed between the insulating layers;
   conductive layers interposed between the insulating layers and surrounding sidewalls of the dielectric layers, respectively, wherein each of the conductive layers and each of the dielectric layers corresponding thereto are located at substantially the same level; and
   contact plugs coupled to the conductive layers, respectively,
   wherein one of the contact plugs coupled to one of the conductive layers passes through at least one of the dielectric layers located under the one of the conductive layers.

2. The interconnection structure of claim 1,
   wherein each of the conductive layers includes a pad region surrounding a terminal sidewall of each of the dielectric layers, and
   wherein the contact plug is in contact with a top surface and two sidewalls of the pad region.

3. The interconnection structure of claim 2, wherein a diameter of the contact plug is greater than a width of pad region.

4. The interconnection structure of claim 1, wherein each of the conductive layers surrounds at least two sidewalls including a terminal sidewall of each of the dielectric layers.

5. The interconnection structure of claim 4, further comprising:

a slit insulating layer in contact with an exposed sidewall of the dielectric layer,
wherein the conductive layer surrounds the at least two sidewalls including the terminal sidewall of each of the dielectric layers leaving the exposed sidewall of the dielectric layer to contact the slit insulating layer.

6. The interconnection structure of claim 5, wherein the slit insulating layer is in contact with a sidewall of the conductive layer opposite to the exposed sidewall of the dielectric layer.

7. The interconnection structure of claim 1, wherein each of the conductive layers surrounds at least three sidewalls including a terminal sidewall of each of the dielectric layers.

8. The interconnection structure of claim 7, wherein the conductive layers surrounding at least two of the three sidewalls are connection regions in contact with and located between a sidewall of the dielectric layer and a slit insulating layer.

9. The interconnection structure of claim 1, wherein each of the contact plugs contacts a top surface and a sidewall of each of the conductive layers, respectively.

10. The interconnection structure of claim 1, wherein the conductive layers are coupled to stacked gate electrodes included in a cell structure, respectively.

11. The interconnection structure of claim 10, wherein each of the conductive layers comprises:
a pad region surrounding a terminal sidewall of the dielectric layer and contacting the contact plug; and
a connection region coupling the pad region to the gate electrode.

12. A semiconductor device, comprising:
a first stacked structure including first to n-th insulating layers and first to n-th dielectric layers stacked alternately with each other, and first to n-th conductive layers interposed between the first to n-th insulating layers and surrounding sidewalls of the first to n-th dielectric layers, respectively, where n is a natural number of 2 or more, wherein the first stacked structure has a stepped structure;
a second stacked structure including first to 2n-th insulating layers and first to 2n-th dielectric layers stacked alternately with each other, and first to 2n-th conductive layers interposed between the first to 2n-th insulating layers and surrounding sidewalls of the first to 2n-th dielectric layers, respectively, wherein n+1st to 2n-th insulating layers, n+1st to 2n-th dielectric layers and n+1st to 2n-th conductive layers have a stepped structure; and
a slit insulating layer located between the first stacked structure and the second stacked structure,
wherein the second stacked structure is taller than the first stacked structure.

13. The semiconductor device of claim 12, further comprising:
first contact plugs coupled to the first to n-th conductive layers of the first stacked structure, respectively, wherein the first contact plugs at least partially pass through the first to n-th insulating layers and the first to n-th dielectric layers located under the first to n-th conductive layers coupled thereto; and
second contact plugs coupled to the n+1st to 2n-th conductive layers of the second stacked structure, respectively, wherein the second contact plugs at least partially pass through the first to 2n-th insulating layers and the first to 2n-th dielectric layers located under the first to 2n-th conductive layers coupled thereto.

14. The semiconductor device of claim 13, further comprising a peripheral region located under the first and second stacked structures and including transistors and metal lines coupled to the transistors,
wherein the first and second contact plugs pass completely through the insulating layers and the dielectric layers located under the conductive layers coupled thereto and are coupled to the metal lines.

15. The semiconductor device of claim 12, further comprising a cell structure located in a cell region and including gate electrodes and insulating layers stacked alternately with each other, wherein the gate electrodes are coupled to the conductive layers, respectively.

16. The semiconductor device of claim 14, wherein each of the conductive layers surrounds at least two sidewalls including a terminal sidewall of each of the dielectric layers.

17. The semiconductor device of claim 14, wherein each of the conductive layers surrounds at least three sidewalls including a terminal sidewall of each of the dielectric layers.

18. An interconnection structure, comprising:
an upper conductive layer including an upper dielectric layer and a pad region surrounding a terminal side wall of the upper dielectric layer;
a lower conductive layer including a lower dielectric layer and a pad region surrounding a terminal side wall of the lower dielectric layer, the lower conductive layer located below the upper conductive layer; and
a contact plug contacting the pad region of the upper conductive layer and passing through the lower dielectric layer located under the pad region surrounding the terminal side wall of the upper dielectric layer.

19. The interconnection structure of claim 18, wherein the contact plug partially passes through the upper dielectric layer.

20. The interconnection structure of claim 18, wherein the contact plug partially passes through the lower dielectric layer.

21. The interconnection structure of claim 1, wherein each of the conductive layers and each of the dielectric layers corresponding thereto have substantially the same thickness.

22. The interconnection structure of claim 18, wherein the lower dielectric layer is located below the pad region of the upper conductive layer.

23. An interconnection structure, comprising:
insulating layers stacked stepwise;
dielectric layers interposed between the insulating layers;
conductive layers interposed between the insulating layers and surrounding sidewalls of the dielectric layers, respectively, wherein each of the conductive layers and each of the dielectric layers corresponding thereto are located at substantially the same level; and
contact plugs coupled to the conductive layers, respectively,
wherein one of the contact plugs contacts one of the conductive layers and one of the dielectric layers located at substantially the same level, and
wherein the one of the contact plugs passes through at least one of the dielectric layers located under the one of the conductive layers.

* * * * *